United States Patent [19]

Masuda et al.

[11] Patent Number: 5,410,513
[45] Date of Patent: Apr. 25, 1995

[54] ADDRESS POINTER GENERATING AND USING A COINCIDENCE SIGNAL IN A SEMICONDUCTOR MEMORY DEVICE AND METHOD OF GENERATING AN ADDRESS

[75] Inventors: Shinichi Masuda; Masatoshi Kimura; Tetsuya Matsumura, all of Hyogo, Japan

[73] Assignee: Mitsubishi Denki Kabushiki Kaisha, Tokyo, Japan

[21] Appl. No.: 958,051

[22] Filed: Oct. 8, 1992

[30] Foreign Application Priority Data

Oct. 8, 1991 [JP] Japan .................................. 3-260276
Aug. 20, 1992 [JP] Japan .................................. 4-221316

[51] Int. Cl.⁶ .............................................. G11C 8/00
[52] U.S. Cl. ..................................... 365/236; 365/240
[58] Field of Search ...................... 365/236, 240, 222

[56] References Cited

U.S. PATENT DOCUMENTS

| | | | |
|---|---|---|---|
| 4,395,764 | 7/1983 | Matsue ............................... | 365/240 |
| 5,144,525 | 9/1992 | Saxe et al. ......................... | 365/240 |
| 5,146,577 | 9/1992 | Babin ................................. | 365/236 |
| 5,206,834 | 4/1993 | Okitaka et al. .................... | 365/236 |

FOREIGN PATENT DOCUMENTS 64-86396  3/1989  Japan .

*Primary Examiner*—Joseph A. Popek
*Assistant Examiner*—Son Dinh
*Attorney, Agent, or Firm*—Lowe, Price, LeBlanc & Becker

[57] ABSTRACT

A counter counts clock signals. When a count thereof coincides with the number of rows or columns in a memory cell array, a row or column count coincidence signal is generated and applied to a shift input of a row or column address pointer formed of shift registers. The row or column address pointer is responsive to the clock signals to sequentially shift the count coincidence signal applied to the shift input, so that row or column selecting lines in the memory cell array are sequentially set in the selected state. Since the outputs at final stages in the row and column address pointers are not fed back to the inputs at the first stage thereof, signal delay in a feed back path is not caused, and thus operations for selecting rows and columns are performed at high speed. Also, respective shift register stages in the row and column address pointers have the same construction, and thus regularity thereof is maintained.

17 Claims, 25 Drawing Sheets

FIG. 16
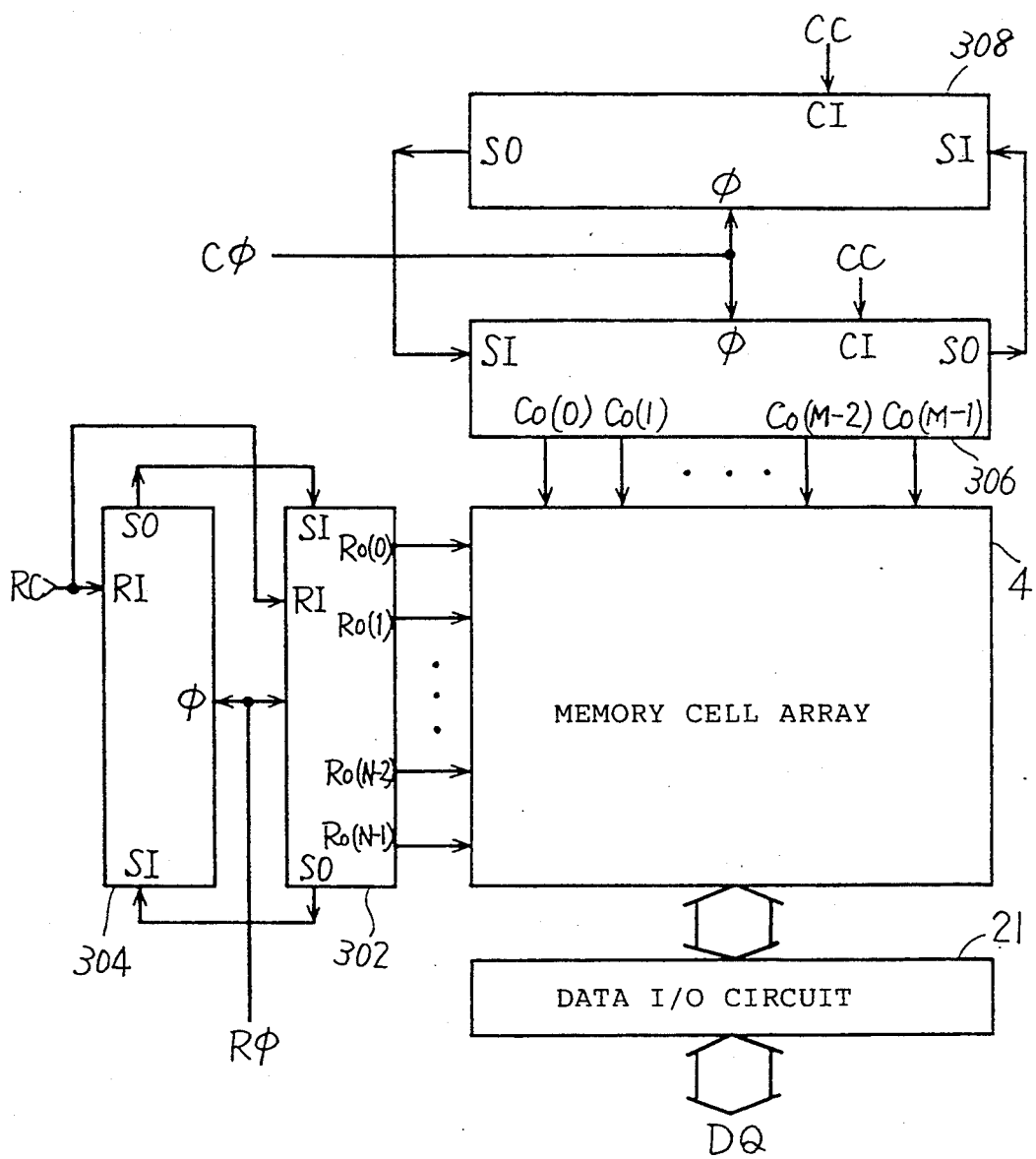
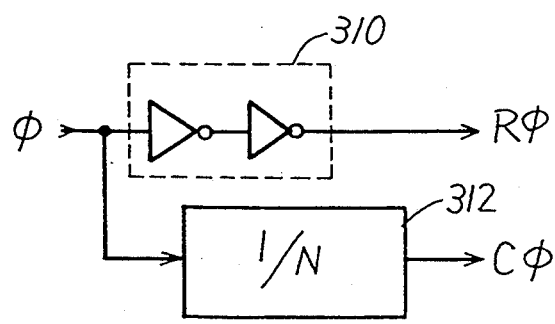

ADDRESS POINTER GENERATING AND USING A COINCIDENCE SIGNAL IN A SEMICONDUCTOR MEMORY DEVICE AND METHOD OF GENERATING AN ADDRESS

BACKGROUND OF THE INVENTION

1. Field of the Invention

The present invention relates to an address pointer for designating an address in a semiconductor memory device, and particularly to an address pointer in a semiconductor memory device in which addresses are sequentially designated. More particularly, the invention relates to a construction of an address pointer for sequentially designating row addresses in a sequentially accessible semiconductor memory device.

2. Description of the Background Art

In devices such as TV receivers, facsimile transmitting/receiving devices and copying machines, in which image information is subjected to digital processing, semiconductor memory devices have been widely used as buffer memories. In these applications, image information is sequentially supplied to a buffer memory regardless of its type, i.e., still image information or dynamic image information. The semiconductor memory device sequentially stores the applied information. In many semiconductor memory devices used for such application, counters have been used as address pointers for designating addresses in order to achieve high-speed access. The semiconductor memory devices in which the addresses are selected in a sequential order are called sequential access memories (will be called "SAMs" hereinafter).

FIG. 20 schematically shows an overall construction of a conventional SAM. Referring to FIG. 20, the SAM includes a memory cell array 4 including a plurality of memory cells which are arranged in a matrix of rows and columns, a row address pointer 10 for selecting the memory cells at one row in memory cell array 4, and a column address pointer 11 for setting the memory cells at one column in memory cell array 4 at a selected state. If one word in memory cell array 4 has multiple bits, a column selecting signal supplied from column address pointer 11 sets one word at the selected state.

The SAM further includes a buffer circuit 20 which generates an internal reset signal in response to a reset signal RST. Buffer circuit 20 includes an inverter circuit 20a for generating a complementary internal reset signal /RST which is an inversion of a reset signal RST, and inverter circuits 20b and 20c which are cascadedly connected in two stages for buffer processing of reset signal RST.

Row address pointer 10 includes a node RH for receiving the complementary internal reset signal /RST from buffer circuit 20, a node RL for receiving the internal reset signal RST from buffer circuit 20, a node $R\phi$ for receiving a row selecting clock signal $R\phi$ which provides a row selecting timing of memory cell array 4, and output nodes RO(0) through RO(−1) which are sequentially set at the selected state in response to the row selecting clock signal $R\phi$.

Output nodes RO(0) through RO(N−1) of row address pointer 10 are arranged corresponding to the rows in memory cell array 4. Specifically, output nodes RO(0) through RO(N−1) of row address pointer 10 correspond to respective row selecting signal lines, each of which selects the memory cells at one row in memory cell array 4. Row address pointer 10 sequentially selects output nodes RO(0) through RO(N−1) in response to the row selecting clock signal $R\phi$, whereby the corresponding rows in memory cell array 4 are sequentially selected.

Row address pointer 10 further includes a node $C\phi O$ which supplies a shift clock signal $C\phi O$ after the output node RO(N−1) is selected. Shift clock signal $C\phi O$ is applied to a clock signal input node $C\phi 1$ of column address pointer 11.

Column address pointer 11 includes output nodes CO(0) through CO(N−1) arranged corresponding to respective columns in memory cell array 4, and reset nodes RH and RL which receive, respectively, a complementary internal reset signal /RST and an internal reset signal RST from buffer circuit 20. Column address pointer 11 shifts a selected output node by one to the adjacent output node each time the clock signal is applied to the clock input node $C\phi I$.

The SAM shown in FIG. 20 may be formed of a dedicated one chip, or may be integrated with other data processing device(s) on a common chip. In the latter case, the reset signal RST and the row selecting clock signal $R\phi$ are transmitted from a control circuit formed on the same chip. Now, an operation will be briefly described below. When the reset signal RST which is an "L" active signal is activated, row address pointer 10 and column address pointer 11 are initialized. Specifically, when the reset signal RST goes to "L", the row address pointer 10 and the column address pointer 11 select output node RO(0) and CO(0), respectively.

Upon each application of row selecting clock signal $R\phi$, row address pointer 10 shifts by one the position of its selected output node. Thereby, the memory cells at the same column but at the different rows are sequentially selected, and information is written into or read from the selected memory cells. After the final output node RO(N−1) is selected in the row address pointer 10, shift clock signal $C\phi O$ is generated and applied to the column address pointer 11.

Column address pointer 11 shifts by one the position of the selected output node in synchronization with the change of output node RO(N−1) in row address pointer 10 into the unselected state. Thereby, the memory cells in the next column are sequentially selected, starting from the first row, and the access to the selected memory cells is performed. The operation continues as long as the clock signal $R\phi$ is applied. In the SAM, selection of the rows and columns in memory cell array 4 is carried out in response to the row selecting signal $R\phi$ and the shift clock signal $C\phi O$, as described above. Therefore, it does not require control signals such as a row address strobe signal /RAS, a column address strobe signal /CAS and a chip selecting signal /CS for taking in an address, which allows high-speed access and thus the processing of the image information at higher speed.

Data is written in or read from sequentially selected memory cells in memory cell array 4 through an I/O circuit 21.

FIG. 21 shows an example of a construction of the memory cell array 4 shown in FIG. 20. In FIG. 21, memory cell array 4 includes a plurality of memory cells arranged in a matrix of rows and columns. FIG. 21 representatively shows memory cells arranged in two rows by two columns in a word unit. Memory cells on one row are associated with one row selecting line RO. Memory cells (a word unit) in one column are related to one column selecting line CO. For the memory cells of the respective word units, there are provided AND circuits each for receiving a row selecting signal on the associated row selecting line and a column selecting signal on the associated column selecting line. Specifically, AND circuits AN1 and AN2 are disposed corresponding to respective points at which the row selecting line RO(i) intersects the column selecting lines CO(j) and CO(j+1). AND circuits AN3 and AN4 are disposed corresponding to the points at which the row selecting line RO(i+1) intersects the column selecting lines CO(j) and CO(j+1).

AND circuit AN1 selects the corresponding memory cells MWij of one word when corresponding row selecting line RO(i) and column selecting line CO(j) are selected. AND circuit AN2 selects memory cells MWi(j+1) of one word when row selecting line RO(i) and column selecting line CO(j+1) are selected.

In a similar manner, AND circuits AN3 and AN4 select memory cells MW(i+1)j of one word and memory cells MW(i+1)(j+1) of one word when row selecting line RO(i+1) and column selecting lines CO(i) and CO(j+1) are selected, respectively.

Provision of AND circuits at the respective intersections of the row selecting lines RO and column selecting lines CO ensures the selection of only the memory cells of one word, and prevents undesired writing and reading of data.

The memory cells may be dynamic type memory cells, and also may be static type memory cells. Selected memory cells of one word are connected to internal data lines IOa, IOb and IOc, which in turn are connected to I/O circuit 21.

As shown in FIG. 21, when the memory cells are accessed in word units, the addresses are allocated in memory cell array 4 as shown in FIG. 22.

Referring to FIG. 22, the memory cell array 4 includes the memory cells disposed in N rows and M columns. The memory cells of one word are connected at one column. In this arrangement, the memory cell at address (0, 0) in the memory cell array 4 is first selected, and then the memory cells at the addresses (1, 0), ..., (N−1, 0) are sequentially selected. After the selection of the memory cells (word unit) in the 0th column, the access starts from the memory cell at the 0th row in the first column. Finally, the memory cells (one word) at the (N−1)th row and (M−1)th column are accessed, and then the memory cells at the 0th row and 0th column are accessed again.

FIG. 23 is a block diagram showing a construction of the row address pointer shown in FIG. 20. In FIG. 20, the row address pointer 10 includes cascadedly connected shift registers 9A and 9B1−9B(N−1) at N stages. Shift register 9A at a first stage is reset to "1" in response to the reset signals applied to reset nodes RH and RL. Shift registers 9B(1)−9B(N−1) is reset to "0" in response to reset signal RL. In the following description, each node and each signal applied thereto are designated by the same reference character.

Each of shift registers 9A and 9B1−9B(N−1) includes an input node SI, an output node SO and clock input nodes $\phi$ and $/\phi$. Each of shift registers 9A and 9B1−9B(N−1) performs a shift operation in response to clock signals R$\phi$ and /R$\phi$ of two phases. Specifically, each shift register is responsive to clock signal R$\phi$ to latch the applied signal, and is responsive to clock signal /R$\phi$ to output the latched signal. Row selecting signals for selecting row selecting lines RO(0)−RO(N−1) are supplied from output nodes SO of shift registers 9A and 9B1−9B(N−1), respectively.

Output node SO of shift register 9B(N−1) at the final stage in row address pointer 10 is coupled to the input node SI of shift register 9A at the first stage through drive circuits DV1 and DV2 in an even number of stages. Due to this ring configuration, rows in the memory cell array are repeatedly and sequentially selected. Drive circuits DV1 and DV2 are provided for reducing the delay in signal transmission from the final shift register 9B(N−1) to the first shift register 9A, and have different driving capabilities with each other. Specifically, drive circuit DV2 has the driving capability larger than that of drive circuit DV1. Final shift register 9B(N−1) also generates shift clock signal C$\phi$0 to be applied to column address pointer 11.

Row address pointer 10 also includes inverter circuits IV1, IV2 and IV3 for generating internal clock signals R$\phi$ and /R$\phi$ in response to row selecting clock signal R$\phi$ applied to clock input node R$\phi$I. Inverter circuits IV1 and IV2 are cascadedly connected to generate the clock signal R$\phi$. Inverter circuit IV3 inverts the clock applied to the node R$\phi$I to produce the complementary clock signal /R$\phi$.

FIG. 24 shows an example of a construction of the column address pointer shown in FIG. 20. In FIG. 24, column address pointer 11 has a construction similar to that of row address pointer 10 shown in FIG. 23, and it includes shift registers which are cascadedly connected in M stages. Constructions of these shift registers 9A and 9B1−9B(M−1) are similar to those of shift registers 9A and 9B1−9B(N−1) shown in FIG. 23, except that clock signals applied to clock input nodes $\phi$ and /$\phi$ are not the signals R$\phi$ and /R$\phi$ but the clock signals C$\phi$ and /C$\phi$ which in turn are generated in response to shift clock signal C$\phi$O supplied from row address pointer 10. Column selecting signals CO(0)−CO(M−1) for selecting the respective column selecting lines are supplied from output nodes SO of shift registers 9A and 9B1−9B(M−1).

Also in column address pointer 11, the output node SO of the final shift register 9B(M−1) is coupled to the input node SI of the first shift register 9A through drive circuits DV3 and DV4 which are cascadedly connected in two stages. Drive circuits DV3 and DV4 are inverter circuits, and can transmit the output of the final shift register 9B(M−1) to the input node SI of the first shift register 9A at high speed.

Column address pointer 11 further includes inverter circuits IV4, IV5 and IV6 for generating clock signals C$\phi$ and /C$\phi$ of two phases in response to shift clock signal C$\phi$O. Inverter circuits IV4 and IV5 are cascadedly connected to generate clock signal C$\phi$. Inverter circuit IV6 inverts the signal applied to the input node C$\phi$I to form the complementary clock signal /C$\phi$. Now, operations of row and column address pointers shown in FIGS. 23 and 24 will be described below with reference to a waveform diagram of FIG. 25.

First, reset signal RST is generated, so that an initial value of shift register 9A at the first stage of row address pointer 10 is set at "1", and initial values of the other shift registers 9B1−9B(N−1) are set at "0". The value of "1" which is initially set in the first shift register 9A in row address pointer 10 is output in response to the falling of row selecting clock signal R$\phi$. In response to this falling of the clock signal R$\phi$, row selecting signal R(0) is generated. Meanwhile, reset signal RST is also applied to column address pointer 11, so that the initial value of the first shift register 9A in the column address pointer is set at "1" and initial values of the other shift registers 9B1—9B(M−1) are set at "0". Therefore, only column selecting line CO(0) is set at the selected state by column address pointer 11.

The clock signal for column address pointer 11 is formed by the shift clock signal C$\phi$O supplied from row address pointer 10. Therefore, until row address pointer 10 generates shift clock signal C$\phi$O, the shift operation is not performed in column address pointer 11, and column selecting line CO(0) is kept in the selected state. When all the rows at the 0th column are sequentially set at the selected state, shift clock signal C$\phi$O is generated by the final shift register 9B(N−1) in row address pointer 10. Shift clock signal C$\phi$O is applied to column address pointer 11, which performs the shift operation in response to the falling of the shift clock signal C$\phi$O to set the adjacent column selecting signal CO(1) at the selected state. Thereafter, the above operation is repeated, and finally, column selecting line CO(N−1) is selected.

When the output at the final stage in row address pointer 10 changes from "1" to "0", output CO(0) of the first shift register 9A in column address pointer 11 goes to "0", and output CO(1) of the next adjacent shift register 9B1 goes to "1". This operation is repeated, so that the respective words in memory cell array 4 are sequentially selected.

In column address pointer 11 shown in FIG. 24, shift clock signals C$\phi$ and /C$\phi$ are generated in response to the shift clock signal C$\phi$o supplied from row address pointer 10. Shift clock signal C$\phi$o is generated when all the rows at one column are selected by row address pointer 10, i.e., when output RO(N−1) is generated from the final shift register 9B(N−1) in the row address pointer 10. In this case, column selecting line CO(0) may not be selected in response to reset signals RH and RL at the initial state of column address pointer 11 (if row and column address pointers 10 and 11 have the same construction). This can be prevented using the structure shown in FIG. 26 by applying to column address pointer 11 a shift clock signal formed by AND processing of a delayed falling signal of the reset signal RST and column selecting clock signal R$\phi$. That is, in FIG. 26, the structure includes a delay circuit 400 for delaying only the falling of the reset signal RST, an AND circuit 402 for taking a logical product of an output of the delay circuit 400 and the clock signal R$\phi$, and an OR circuit 404 for taking a logical sum of an output of AND circuit 402 and the shift clock signal C$\phi$O. The delay circuit 400 includes cascaded inverters 410 and 412 for delaying the reset signal RST, and an OR circuit 414 receiving an output of the inverter 412 and the reset signal RST. Now, operation of the structure of FIG. 26 will be described with reference to the operating waveform diagram of FIG. 27.

The reset signal RST has only the falling delayed by the delay circuit 400. More specifically, the reset signal RST is delayed by the cascaded inverters 410 and 412. OR circuit 414 produces an "H" signal when at least one of its inputs is at "H" level. Thus, the delay circuit 400 generates a delayed fall signal of the reset signal RST. When the delay period is appropriate such that the fall-delayed reset signal has active period ("H" period.) overlapping with the generation of a first shift clock signal R$\phi$, AND circuit 402 generates an active signal to allow OR circuit 400 to produce the shift clock signal C$\phi$I.

As described above, by using the outputs of the shift registers as the signal for selecting a row and a column, each word in the memory cell array can be sequentially accessed at high speed. In order to achieve this sequential operation, the outputs of the final shift registers 9B(N−1) and 9B(M−1) in row and column address pointers 10 and 11 are returned to the first shift registers 9A through drive circuits DV1 and DV2 and drive circuits DV3 and DV4, respectively.

Drive circuits DV1–DV4 are employed for the following reason. As the memory capacity of the semiconductor memory device increases, the number of the rows and columns in the memory cell array increases. Row address pointer 10 and column address pointer 11 include the shift register stages of which numbers are equal to the numbers of the rows and columns in memory cell array 4, respectively. Therefore, with the increase of the memory capacity of the semiconductor memory device, a distance between the shift registers at the final and first stages in the row (column) address pointer increases. This increases a length of a signal line through which the output of the final shift register in the row (column) address pointer is fed back to the input of the first shift register, and thus causes delay of the signals due to R (interconnection resistance) and C (interconnection capacitance) to the signals transmitted therethrough.

Drive circuits DV1–DV4 are provided in order to minimize the signal propagation delay due to the RC delay in the signal lines for feed back. The drive circuits DV1–DV4 are formed of inverter circuits having large driving capabilities (i.e., large transistor sizes). As the numbers of the rows and/or columns in the memory cell array increase, the distances between the outputs of the final shift registers and the inputs of the first shift registers in the address pointers increase, and thus drive circuits DV1–DV4 having larger driving capabilities are needed.

The drive circuits are generally formed of MOS (insulated gate type) transistors because of their low power consumption. If the transistor size is increased for increasing the driving capability of the drive circuit, an input gate capacitance (i.e., capacitance between source/drain and gate) increases. In order to achieve the high-speed driving of the large input capacitance, it is necessary to increase the driving capability of the final shift register in the row (column) address pointer. Therefore, the final shift register in the row (column) address pointer and the other shift registers must employ transistors having different sizes. This impairs regularity in the configuration of the semiconductor memory device. Generally, if the regularity of components is impaired in the configuration of the semiconductor memory device, efficient arrangement of the components becomes impossible, resulting in reduction of an area utilizing efficiency. The problem that the regularity is impaired will be specifically described below.

FIG. 28 shows a correspondence between the row address pointer and the memory cells. As shown in FIG. 28, row address pointer 10 is practically disposed in a central portion of the memory cell array 4. This arrangement is employed for shortening the row selecting lines so as to transmit a row selecting signal to the end of a selected row selecting line at high speed. Row address pointer 10 includes shift registers arranged in two lines. In the same figure, there are shown four shift registers 9B(N−4)—9B(N−1). The shift registers each are arranged in two lines to accord to a pitch of the memory cells.

If the final shift register 9B(N−1) had the transistor size larger than those of the other shift registers 9B(N−4)−9B(N−2), final shift register 9B(N−1) would protrude outside an area end A allotted to the semiconductor memory device, and this area end would be extended to an area end B in FIG. 28, resulting in increase of the area occupied by the semiconductor memory device.

In order to reduce the input gate capacitance of the drive circuit, the number of the stages of the drive circuit is made four or more, and the transistor sizes are made sequentially increased from the input stage to the output stage. (Generally, it has been known that if the driving capabilities of the drive circuits are increased with a certain ratio, the driving speed can be increased.) In FIGS. 23 and 24, driving circuits DV1 and DV3 and driving circuits DV2 and DV4 are shown having different transistor sizes.

In this construction, however, the delay time in the feed back from the final shift register in the row (column) address pointer to the initial shift register 9A cannot be reduced to zero. Since the final shift register 9B(N−1) or 9B(M−1) in the row (column) address pointer drives the drive circuit and also generates the row (column) selecting signal to drive the row (column) selecting line, these final shift registers 9B(N−1) and 9B(M−1) are required to have the driving capabilities larger than those of the other shift registers. Therefore, it is difficult to maintain the regularity in the configuration of the semiconductor memory device.

SUMMARY OF THE INVENTION

It is an object of the invention to provide an address pointer which can access memory cells at high speed even if a semiconductor memory device has a large memory capacity.

It is another object of the invention to provide an address pointer which prevents delayed propagation, which may be caused by interconnection resistance/capacitance in signal transmission from an output of a shift register at a final stage to an input of a shift register at a first stage, even if the numbers of rows and/or columns in a memory cell array are large.

It is still another object of the invention to provide an address pointer which does not impair regularity in a configuration of a semiconductor memory device.

It is a further object to provide a method of generating address signals at high speed.

An address pointer in a semiconductor memory device according to the invention includes counting means which counts a clock signal and supplies a count coincidence signal each time a count coincides with a number of rows in a memory cell array, and shifting means which sequentially shifts the count coincidence signal supplied from the counting means.

The shifting means includes a plurality of stages corresponding to row selecting lines in the memory cell array. Each stage sets the corresponding row selecting line at the selected state when the count coincidence signal is applied thereto.

The count coincidence signal is generated when a final row at a certain column in the memory cell is selected. The shifting means sequentially shifts the count coincidence signal supplied from the counting means. When this count coincidence signal is applied, each stage in the shifting means sets the corresponding row selecting line at the selected state. When changing the row, a first row at the next column is selected by the count coincidence signal supplied from the counting means. There is no feed back signal from the final stage to the first stage. Therefore, there is not problem relating to delay of a feed back signal from the final stage to the first stage, and the row selecting lines can be sequentially selected at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 shows an overall construction of a memory device according to another embodiment of the present invention;

DESCRIPTION OF THE PREFERRED EMBODIMENT

Figure 1:
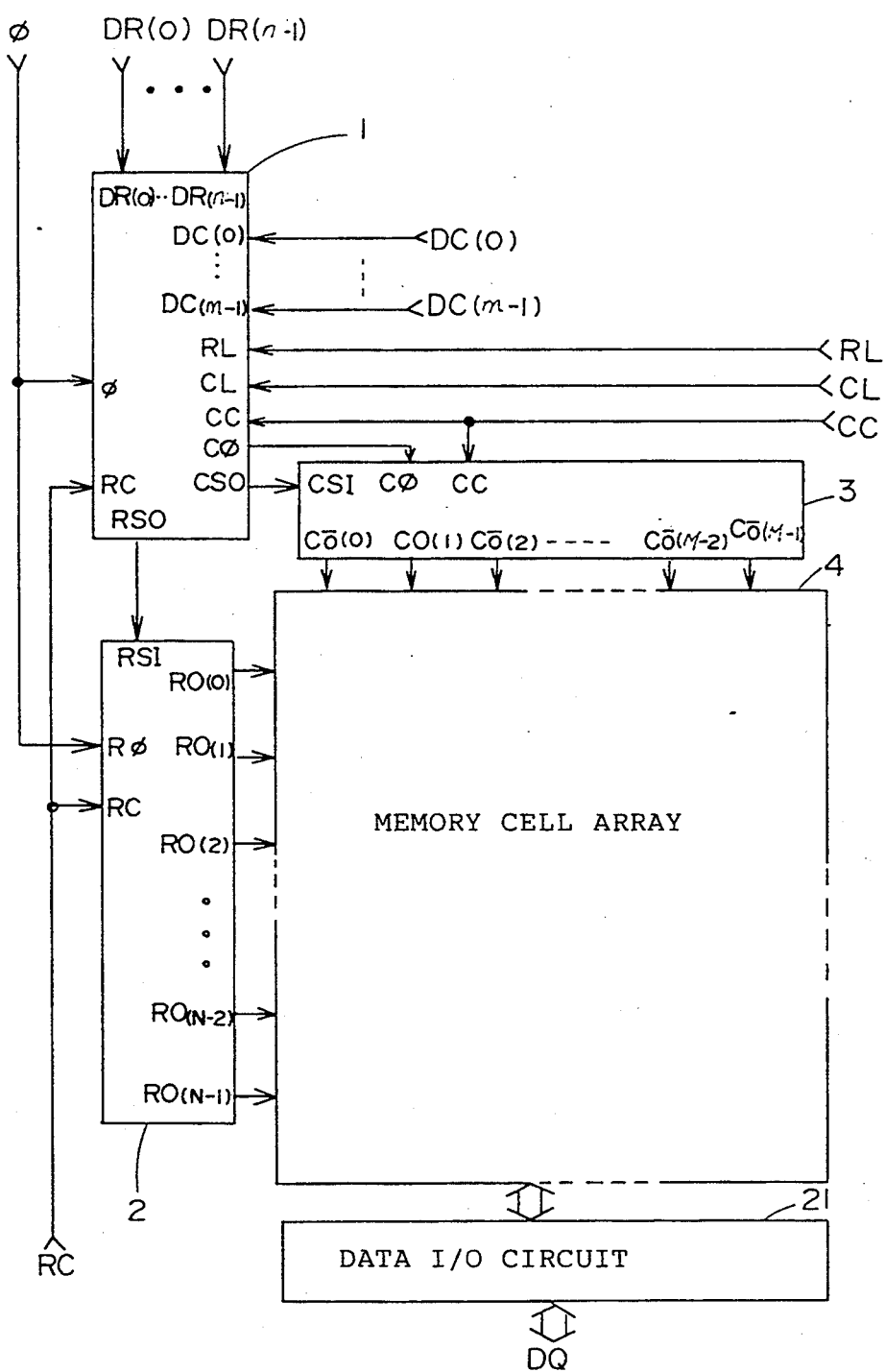
FIG. 1 schematically shows a whole construction of a semiconductor memory device according to an embodiment of the invention.

FIG. 1 schematically shows an overall construction of a semiconductor memory device according to an embodiment of the invention. In FIG. 1, the semiconductor memory device includes a memory cell array 4 which includes a plurality of memory cells arranged in a matrix of rows and columns, and a data I/O circuit 21 which performs writing and reading of data in and from a selected memory cell in memory cell array 4.

Figures 21, 22:
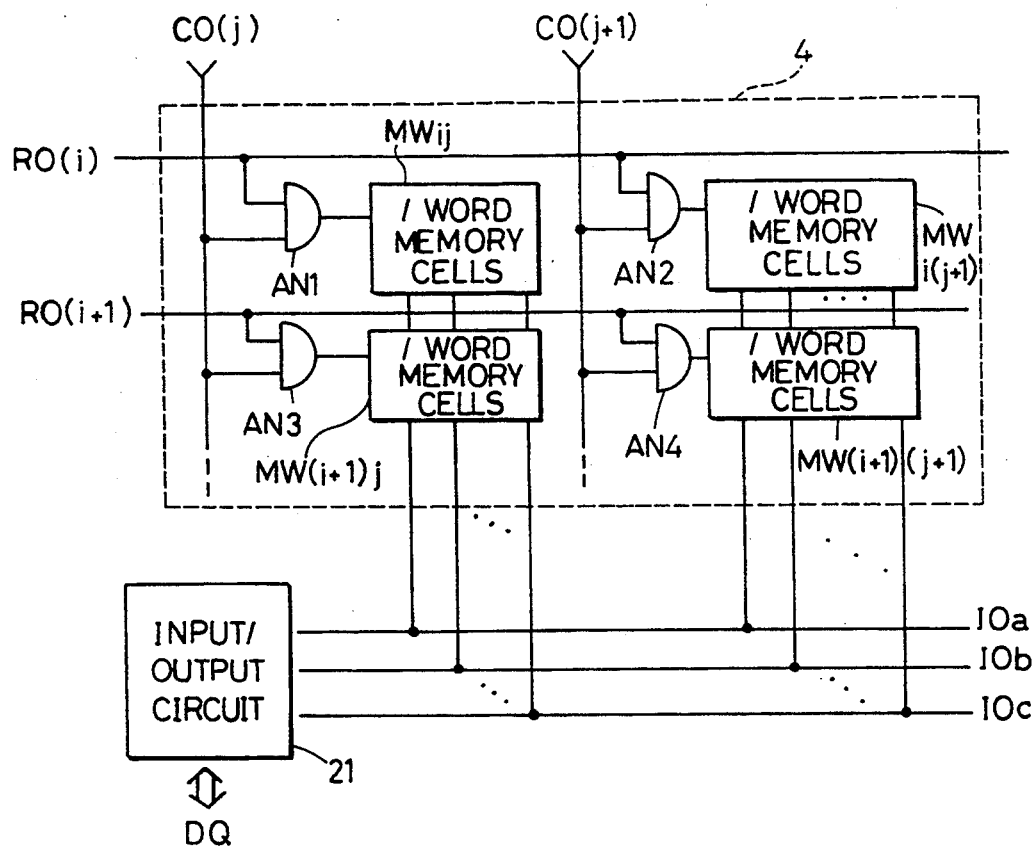
FIG. 21 shows examples of constructions of a memory cell array and an I/O circuit shown in FIG. 20.
FIG. 22 shows a correspondence between row and column selecting lines and a memory cell array shown in FIG. 20.
Figure 23:
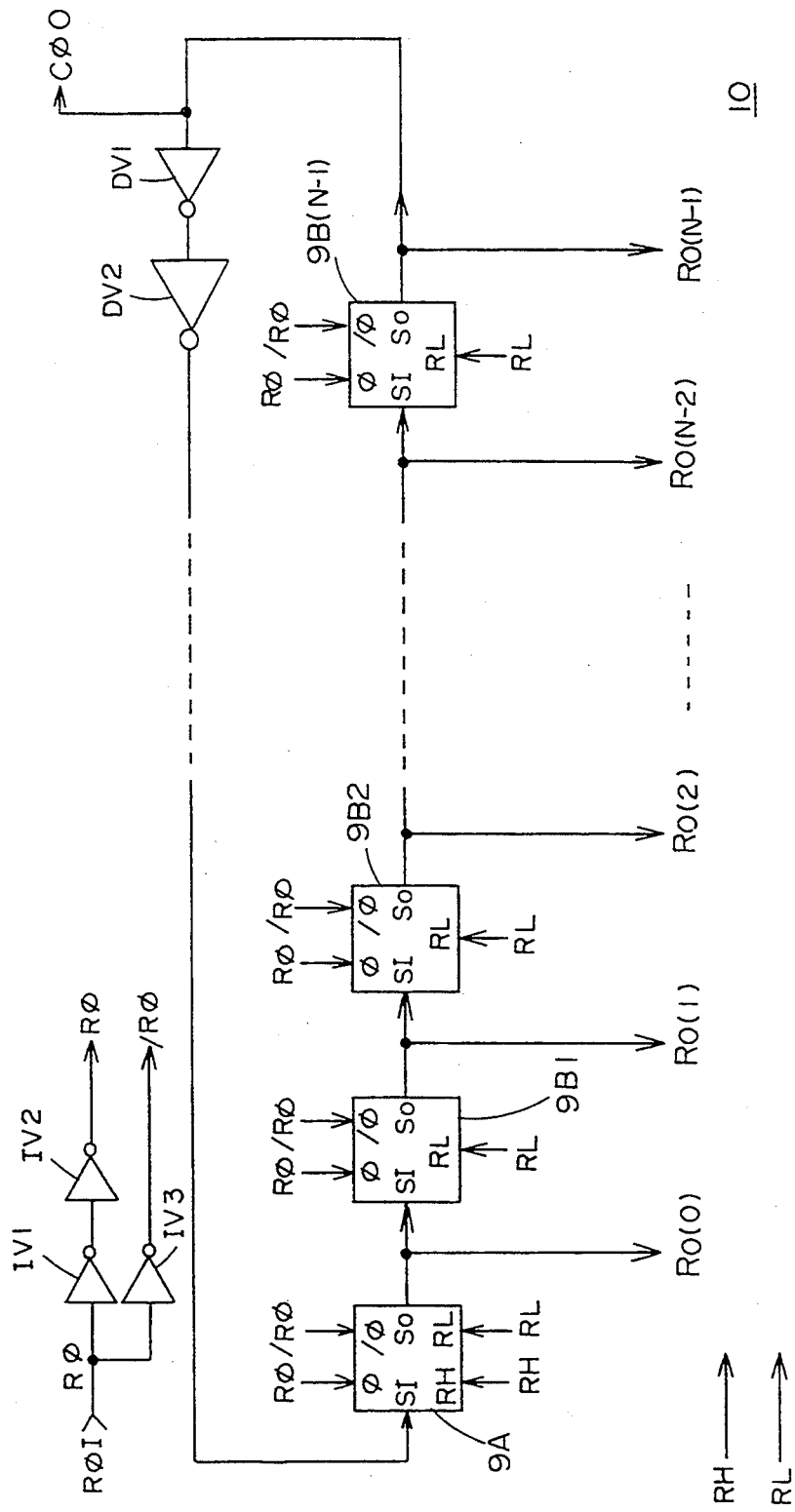
FIG. 23 shows a construction of a row address pointer shown in FIG. 20.
Figure 24:
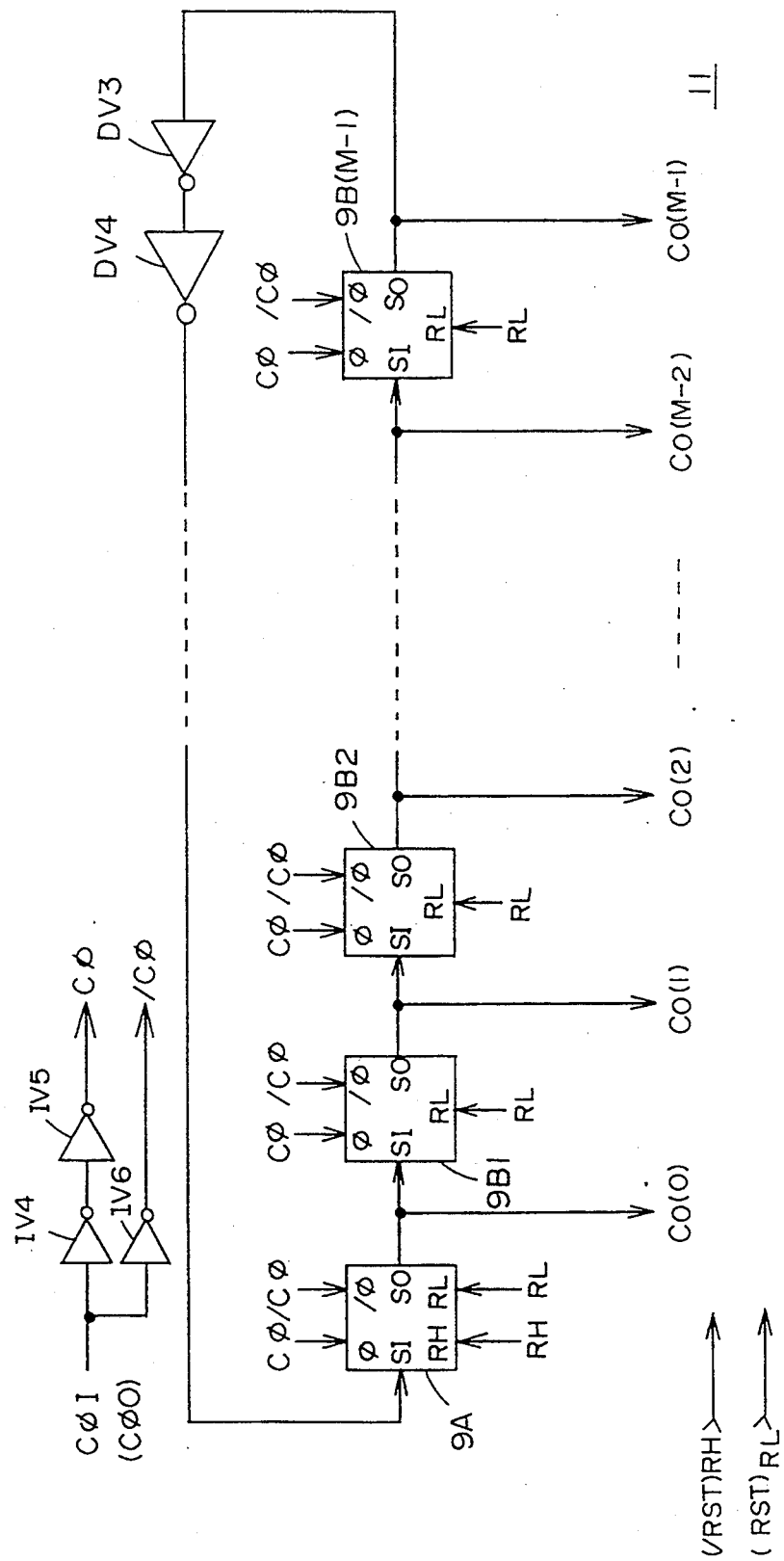
FIG. 24 shows a construction of a column address pointer shown in FIG. 20.
Figure 25:
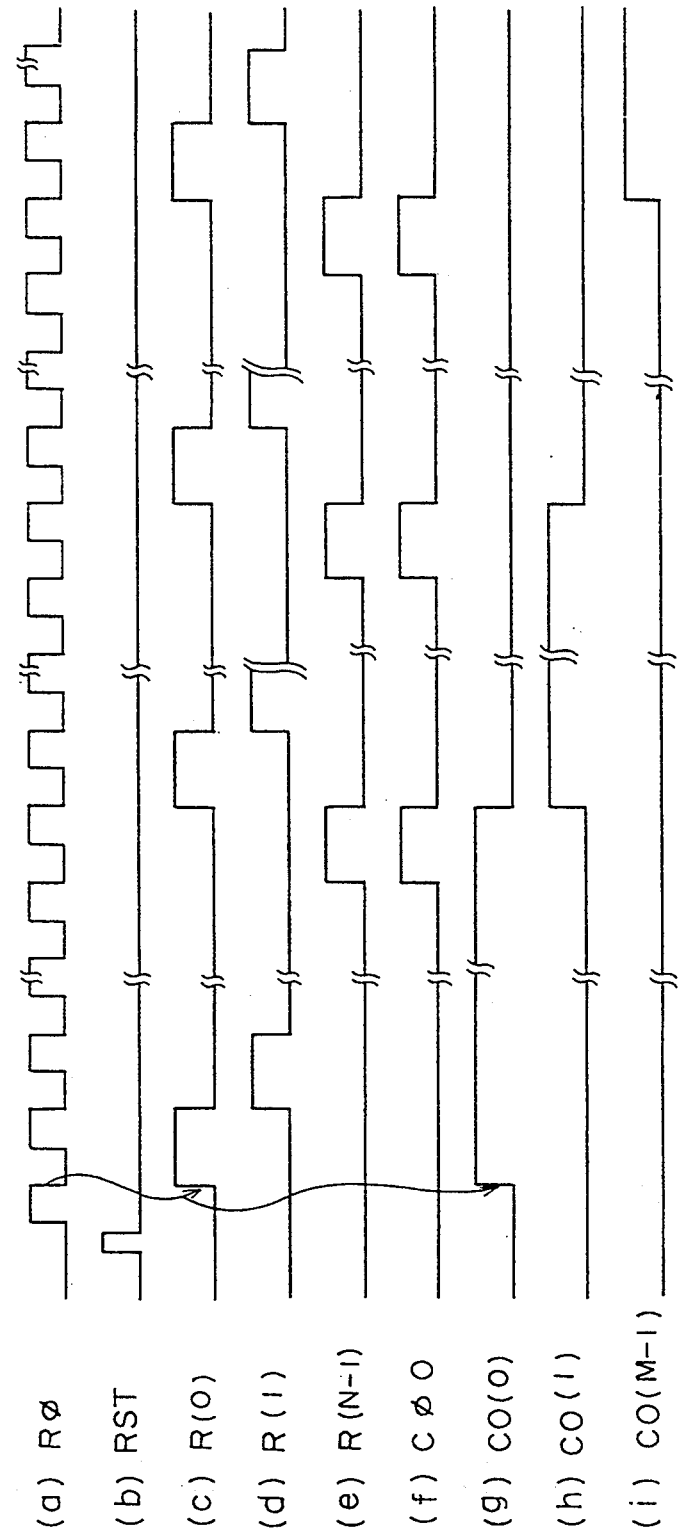
FIG. 25 is a signal waveform diagram showing operations of row and column address pointers shown in FIG. 20.
Figure 26:
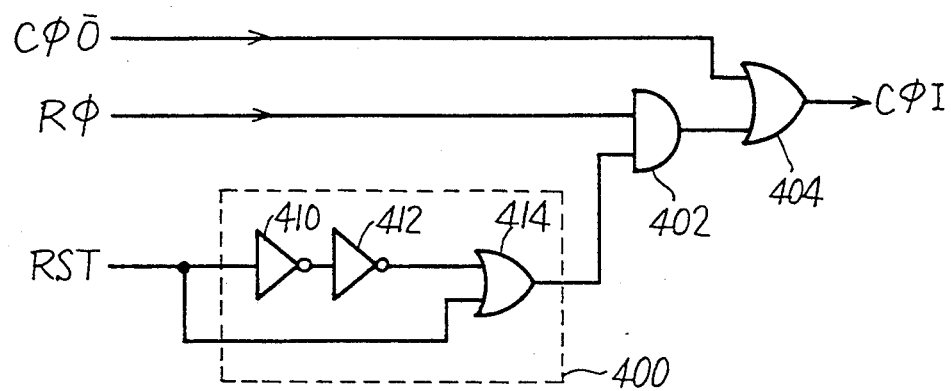
FIG. 26 is a logic showing the structure for generating a column pointer reset signal.
Figure 27:
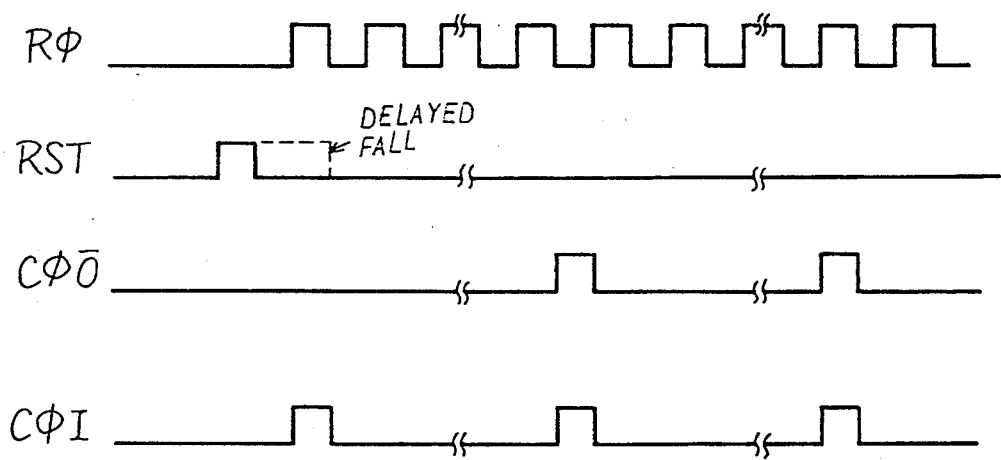
FIG. 27 is an operation waveform diagram for the circuitry of FIG. 27.
Figure 28:
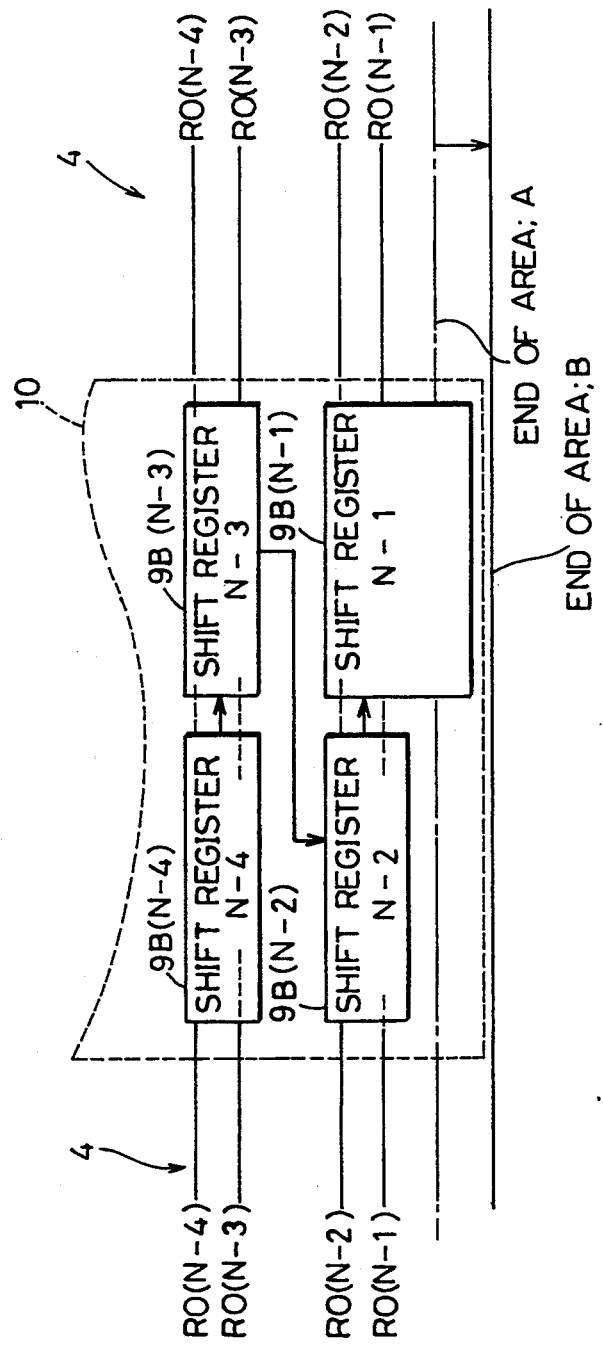
FIG. 28 is a diagram for illustrating a problem of a conventional address pointer.

Memory cell array 4 may comprise a construction shown in FIG. 21, and also may include either a dynamic or static type memory cells. Memory cell array 4 may have a construction in which one word is formed of multiple bits or a single bit. Data I/O circuit 21 may have a construction in which data of multiple bits is input and output in parallel in a unit of the multiple bits or in a bit by bit basis. The semiconductor memory device is basically required only to allow sequential access.

The semiconductor memory device also includes counter means, i.e., a counter 1, which counts clock signals $\phi$ and outputs a row count coincidence signal RSO and a column count coincidence signal CSO each time the counts coincide with the numbers of the rows and columns in memory cell array 4, respectively. The semiconductor memory device further includes a row address pointer 2 serving as row shifting means which sequentially shifts in position the row count coincidence signal RSO from counter 1 to generate a row selecting signal RO, and a column address pointer 3 serving as column shifting means which sequentially shifts in position the column count coincidence signal CSO from counter 1 to generate a column selecting signal CO.

Counter 1 includes row number setting inputs (preload inputs) DR(0)−DR(n−1) for setting a count of the rows, column number setting inputs (preload inputs) DC(0)−DC(n−1) for setting a count of the columns, an input node $\phi$ for receiving a clock signal $\phi$, and row and column reset inputs RC and CC for resetting the counts of the rows and columns, respectively. Counter 1 also includes load signal input nodes RL and CL which receive row and column load signals RL and CL for carrying out initialization of the counts of the rows and columns, respectively. Here, each input node and the signal applied thereto are designated by the same reference character(s).

Counter 1 further includes output nodes RSO and CSO for outputting the count coincidence signals RSO and CSO, respectively, and an output node C$\phi$ for outputting the column clock signal C$\phi$ to control a shift operation of column address pointer 3. Likewise, each output node and the signal supplied therefrom are designated by the same reference character(s).

The row address pointer 2 includes an input node RSI for receiving the row count coincidence signal RSO from counter 1, an input node RC for receiving the row count reset signal RC, a clock input node R$\phi$ for receiving a clock signal $\phi$, and output nodes RO(0)−RO(N−1) corresponding to the respective row selecting lines in memory cell array 4. Row address pointer 2 responds to the clock $\phi$ applied to clock input node R$\phi$ by sequentially shifting the row count coincidence signal applied to input node RSI to sequentially set output nodes RO(0)−RO(N−1) at the selected state.

The column address pointer 3 includes an input node CSI for receiving the column count coincidence signal CSO from counter 1, a clock input node C$\phi$ for receiving the column clock signal C$\phi$ from counter 1, a reset input node C for receiving a column count reset signal CC, and output nodes CO(0)−CO(M−1) corresponding to respective columns in memory cell array 4. Column address pointer 3 responds to the column clock signal C$\phi$ by sequentially shifting column count coincidence signals CSO (CSI) applied to input node CSI and setting output nodes CO(0)−CO(M−1) at the selected state.

Figure 2:
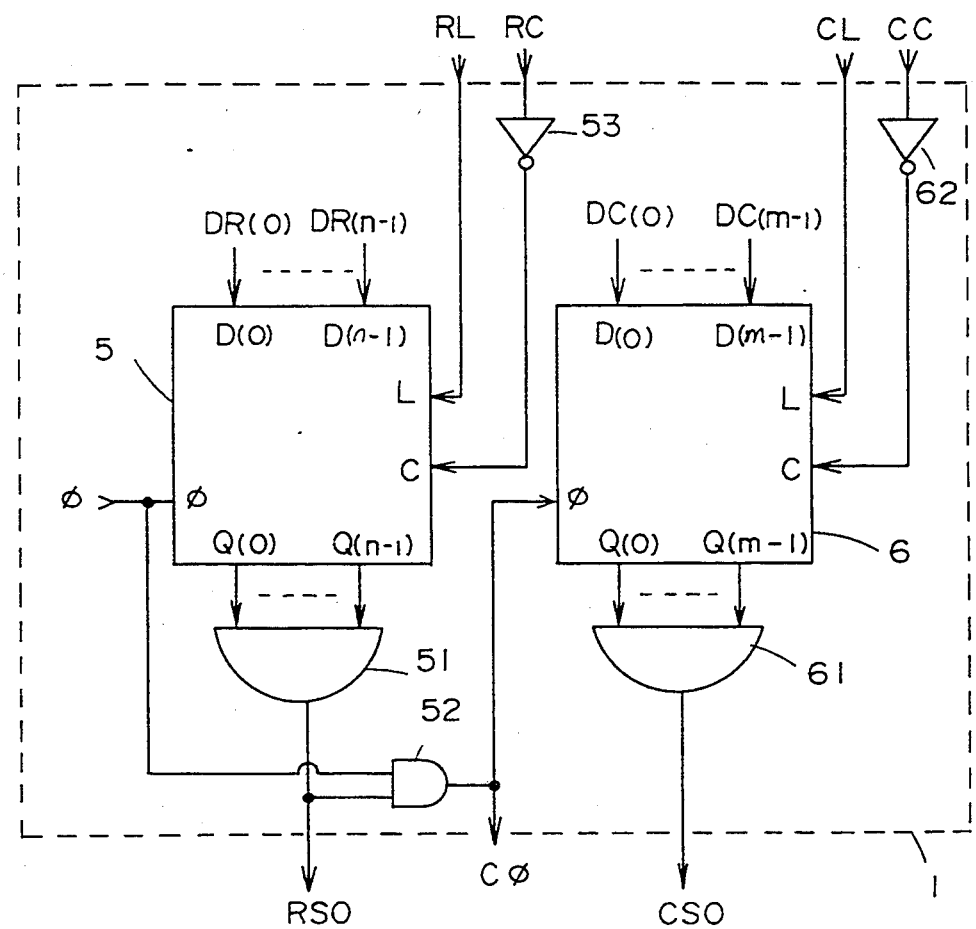
FIG. 2 schematically shows a construction of a counting circuit shown in FIG. 1.

FIG. 2 shows an example of a specific construction of counter 1 shown in FIG. 1. In FIG. 2, counter 1 includes a row counting circuit 5 which performs a counting operation for the row addresses, and a column counting circuit 6 which performs a counting operation for the column addresses. Row counting circuit 5 includes preload inputs D(0)−D(n−1) for receiving preload data DR(0)−DR(n−1), a load input L for receiving a load signal RL, a clear input C for receiving the row count reset signal RC through an inverter circuit 53, and output nodes Q(0)−Q(N−1) for counting the clocks $\phi$ applied to the clock input $\phi$ to output the count. Row counting circuit 5 counts the clocks $\phi$ and indicates the count. When row counting circuit 5 counts a predetermined number (i.e., a number of rows in the memory cell array), all output nodes Q(0)−Q(n−1) thereof supply signals of "1".

Column counting circuit 6 has a construction similar to that of row counting circuit 5, and includes preload inputs D(0)−D(m−1) for receiving preload data DC(0)−DC(m−1), a load input L for receiving a column initial value signal CL, a reset input C for receiving the reset signal CC through an inverter circuit 62, and output nodes Q(0)−Q(m−1) for counting the clocks C$\phi$ applied to clock input $\phi$ to output the count.

Counter 1 further includes an AND circuit 51 for receiving the outputs Q(0)−Q(n−1) of row counting circuit 5, an AND circuit 52 for receiving the clock $\phi$ and an output of AND circuit 51, and an AND circuit 61 for receiving the outputs Q(0)−Q(m−1) of column counting circuit 6. When AND circuit 51 generates the row count coincidence signal RSO, AND circuit 52 generates the column shift clock signal C$\phi$. AND circuit 61 generates the column count coincidence signal CSO.

The counting circuits shown in FIG. 2 are counting circuits of n-bits and m-bits, and their output nodes Q(0)−Q(n−1) and Q(0)−Q(m−1) are activated dependent on the counted clock number. When the count reaches a maximum value, AND circuits 51 and 61 generate the count coincidence signals.

Figure 3:
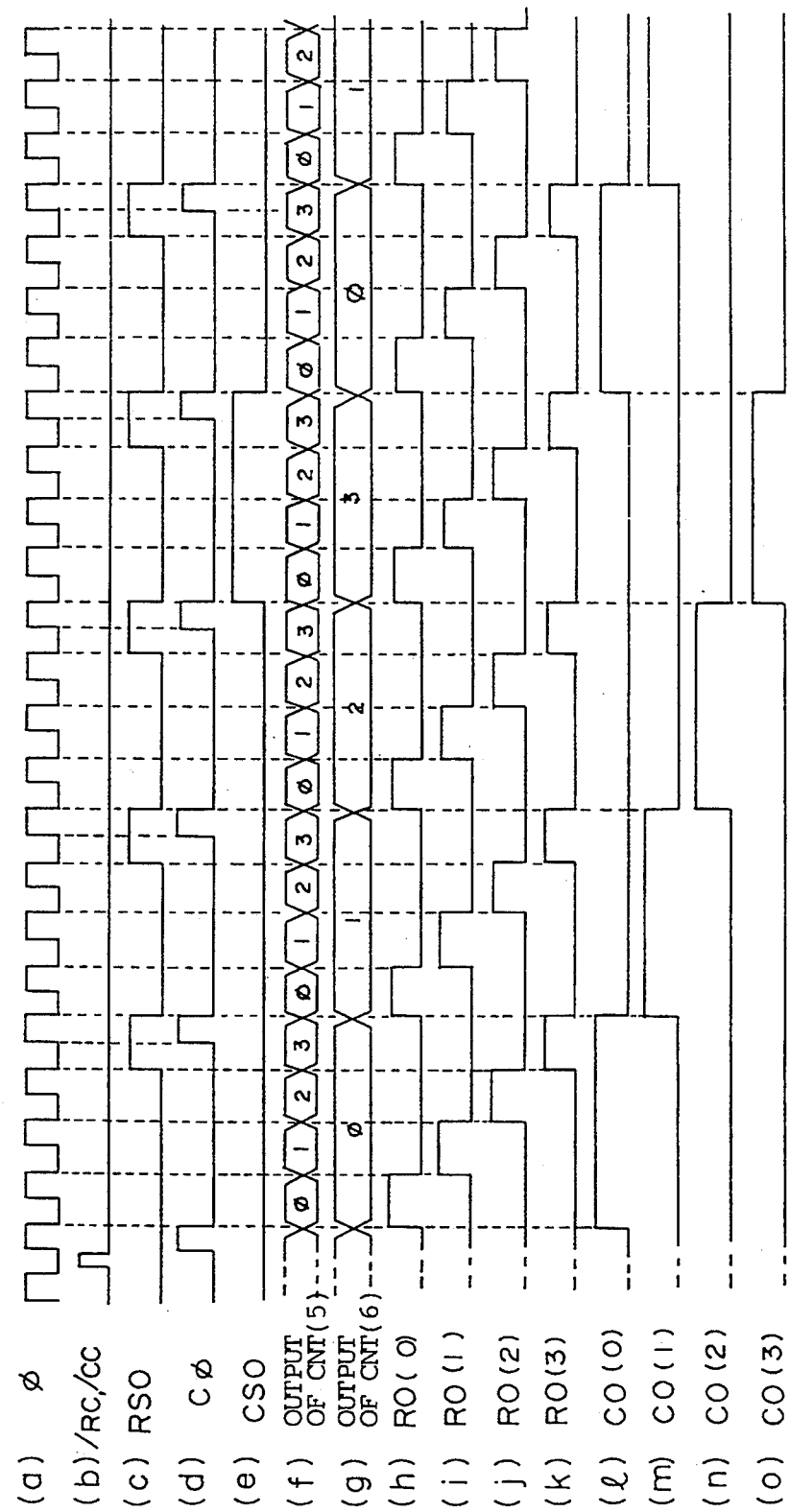
FIG. 3 is a signal waveform diagram showing operations of row and column address pointers and a counter shown in FIGS. 1 and 2.

Instead of the constructions of the counting circuits shown in FIG. 2, there may be employed counting circuits having a preset function as well as a carry generating function. An operation of counting circuit 1 shown in FIG. 1 will be described with reference to a waveform diagram of FIG. 3. The waveform diagram of FIG. 3 represents an operation in a case in which memory cell array 4 has a construction of 4 rows by 4 columns.

First, reset signals RC and CC are generated. Thereby, counter 1 (counting circuits 5 and 6) as well as row address pointer 2 and column address pointer 3 are reset. It is assumed that all preload data DR(0)—DR(n—1) and DC(0)—DC(m—1) of counter 1 are 0.

Row address pointer 2 and column address pointer 3 respond to clock signals $\phi$ and C$\phi$ applied to their clock input nodes R$\phi$ and C$\phi$, respectively, so that the output nodes RO(0) and CO(0) go to "1". Thereby, the memory cell at the 0th row and 0th column in memory cell array 4 is selected. After resetting, clock signal C$\phi$ rises in a manner as will be detailed later.

When clock signal $\phi$ falls thereafter, the count of row counting circuit 5 is incremented by one, so that the outputs of output nodes Q(0) and Q(1) thereof go to "1". Since row count coincidence signal RSO is not yet generated, column shift clock signal C$\phi$ is not generated. Therefore, column counting circuit 6 does not perform a count operation.

Row address pointer 2 and column address pointer 3 shift the output clocks RSO and CSO of row counting circuit 5 and column counting circuit 6. Row address pointer 2 and column address pointer 3 shift, one by one, the output nodes to be selected in accordance with applied clock signals $\phi$ and C$\phi$. In this condition, output node RO(1) of the row address pointer 2 is in the selected state. Since the shift operation is not yet conducted in column address pointer 3, output node CO(0) is in the selected state.

If the row counting circuit 5 counts 4 clock signals $\phi$, all of its output nodes Q(0)—Q(3) go to "1", and the output of AND circuit 51 goes to "1". Thereby, AND circuit 52 generates the column shift clock signal C$\phi$ synchronized with the clock signal $\phi$. The count of column counting circuit 6 is incremented by one, so that output node Q(1) thereof goes to "1".

Row address pointer 2 receives at its input node RSI the row count coincidence signal RSO. In row address pointer 2, output node RO(0) is set again to "1" and other output nodes RO(1)—RO(3) go to "0" in response to the falling of clock signal $\phi$. During this operation, column address pointer 3 also operates in such a manner that the count is incremented by one in response to the column shift clock signal C$\phi$, and output node CO(1) is at the state of outputting "1". In this condition, the memory cell at 1st column and 0th row is designated. This operation is repeated until the memory cell at 1st column and 3rd row is designated. This operation will be further repeated until the memory cell at 3rd row and 3rd column is ultimately designated. When the memory cell at 3rd row and 3rd column is designated, all the outputs of output nodes Q(0)—Q(3) of the column counter 6 are "1", and output CSO of AND circuit 61 is "1". Column count coincidence signal CSO of column counting circuit 6 is applied to the input node CSI of column address pointer 3. Therefore, in column address pointer 3, output node CO(0) is selected again in response to the falling of next clock signal $\phi$.

As described above, in response to the falling of clock signals $\phi$, output nodes RO(0)—RO(3) of row address pointer 2 are sequentially selected, and thus the corresponding row selecting lines are selected.

Meanwhile, one of output nodes of column address pointer 3 is maintained at the selected state for a period of 4 clocks, and the selected node among output nodes CO(0)—CO(3) is sequentially shifted at a cycle of 4 clocks.

In the counter 1, as described above, the row count coincidence signal RSO and column count coincidence signal CSO are generated and applied to input stages of the row and column address pointers 2 and 3 having shift register structures, respectively. Due to this construction, it is not necessary to feed back the outputs RO(M—1) and CO(M—1) at the final stages of row and column address pointers 2 and 3 to the inputs at the first stages. Thus, even if the numbers of the rows and columns in memory cell array 4 increase, the address pointers can sequentially select the rows and columns at high speed without causing any problem associated with the delay of the signals.

Figure 4:
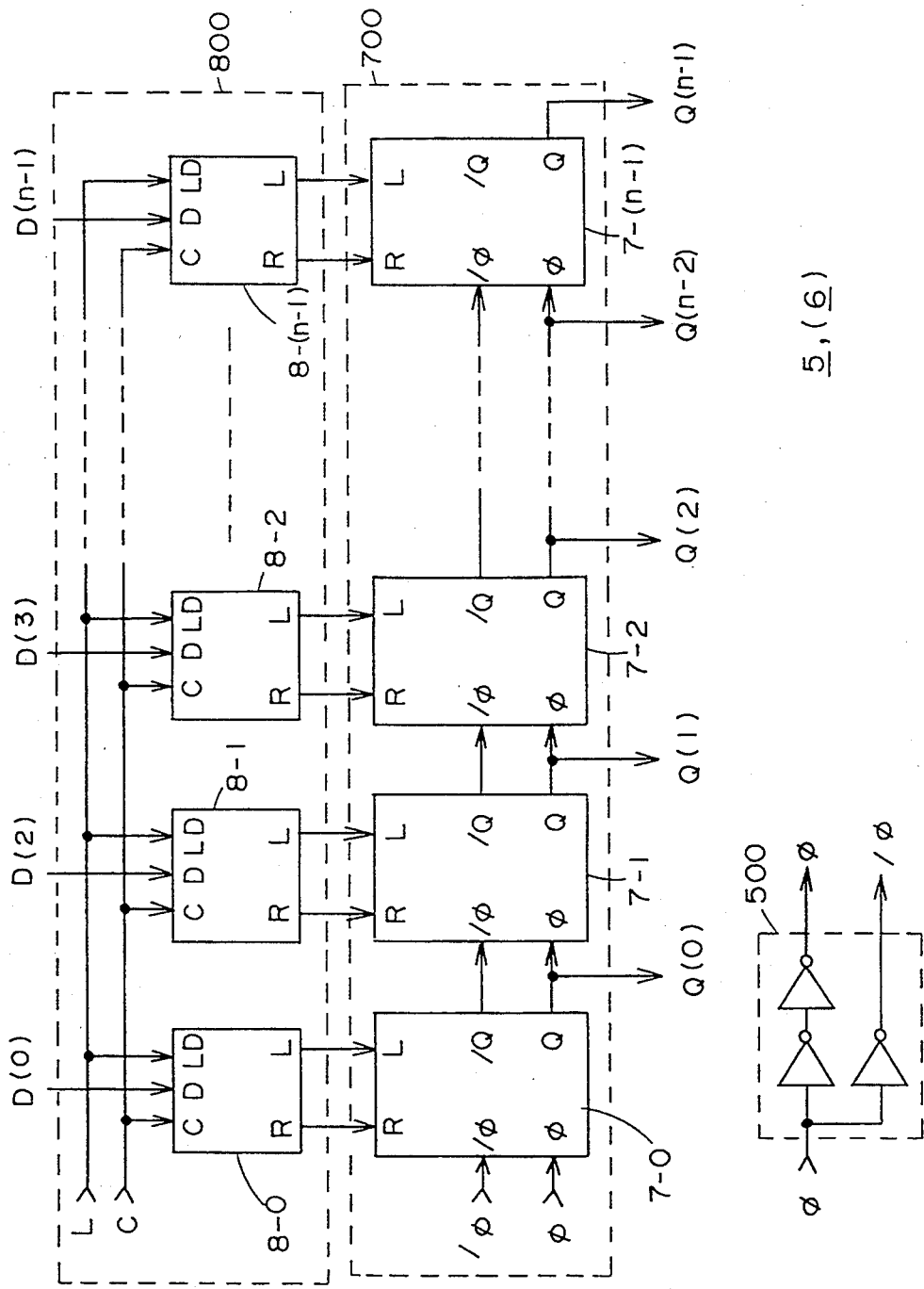
FIG. 4 is a block diagram schematically showing constructions of row and column counting circuits shown in FIG. 2.

Specific constructions of the row and column counting circuits will be described below. Row counting circuit 5 and column counting circuit 6 have the same construction, except that the numbers of the output nodes contained therein as well as the numbers of the preload input nodes for setting the initial values are different with each other. FIG. 4 shows the construction of the row counting circuit.

In FIG. 4, row counting circuit 5 includes an asynchronous n-bit binary counter 700 for counting the clock signals $\phi$ and /$\phi$, a reset/load setting circuit 800 for setting an initial value of binary counter 700, and a clock buffer 500 which performs a buffer processing of clock signal $\phi$ applied to the clock input node $\phi$ to generate complementary clock signals $\phi$ and /$\phi$. Binary counter 700 includes binary counting circuits 7-0-7—(n—1) which are cascadedly connected at n stages. A binary counting circuit 7-0 at a first stage has clock inputs $\phi$ and /$\phi$ which receive the clock signals $\phi$ and /$\phi$ from clock buffer 500. The other binary counting circuits 7-1—7—(n—1) have respective clock inputs connected to receive outputs Q and /Q from binary counting circuits at downstream stages, respectively. Binary counting circuits 7-0—7—(n—1) supply outputs Q(0)—Q(n—1) through respective Q outputs thereof.

Figure 5:
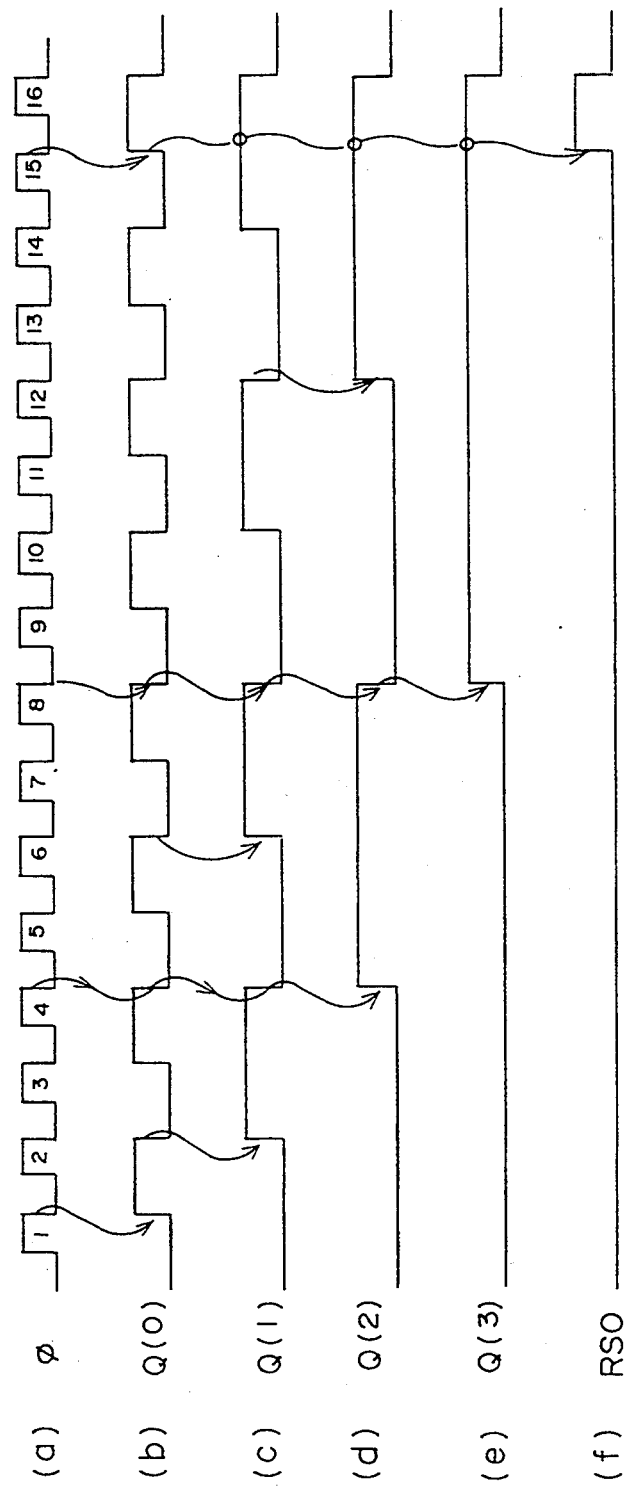
FIG. 5 is a signal waveform diagram showing an operation of n-bit binary counter 700 shown in FIG. 4.

FIG. 5 shows waveforms of an operation of the binary counter 700. FIG. 5 shows an operation of 4-bit binary counter (in a case of n=4). The operation of asynchronous binary counter 700 will be briefly described below with reference to FIG. 5.

The clock input of binary counting circuit 7-0 at the first stage receives complementary clock signals $\phi$ and $\phi$. Output Q of binary counting circuit 7-0 changes in response to the falling of clock signal $\phi$. Output /Q of binary counting circuit 7-(0) outputs a complementary signal of output Q(Q(0)). Binary counting circuit 7-1 at the next stage is responsive to the falling of output Q(Q(0)) of the first binary counting circuit 7-0 to change its output Q(Q(1)). A similar operation is sequentially repeated at subsequent binary counting circuits 7-2 and 7-3.

Thus, output Q(0) changes upon each falling of clock signal $\phi$, output Q(1) changes upon the second falling of the clock signal, output Q(2) changes upon the fourth falling of clock signal $\phi$, and output Q(3) changes upon the eighth falling of clock signal $\phi$. Therefore, when fifteen clock signals $\phi$ are counted, row count coincidence signal RSO is generated, and output Q(0) is set at the selected state again in response to the falling of the sixteenth clock signal φ. Thereby, the sixteen row selecting lines can be sequentially set at the selected state.

In the waveform diagram of FIG. 5, the binary counting circuits generate row count coincidence signal RSO when $2^n-1$ clock signals φ are counted. In this case, if such a construction is employed that all output values Q of binary counting circuits 7-0-7-(n−1) are reset to "1" in response to a clear signal RC, the count of binary counter 700 can be $2^n$. For this purpose, reset/load setting circuit 800 shown in FIG. 4 is employed. Prior to describing reset/load setting circuit 800, specific constructions of binary counting circuits 7-0−7(n−1) contained in binary counter 700 will be described.

Figure 6:
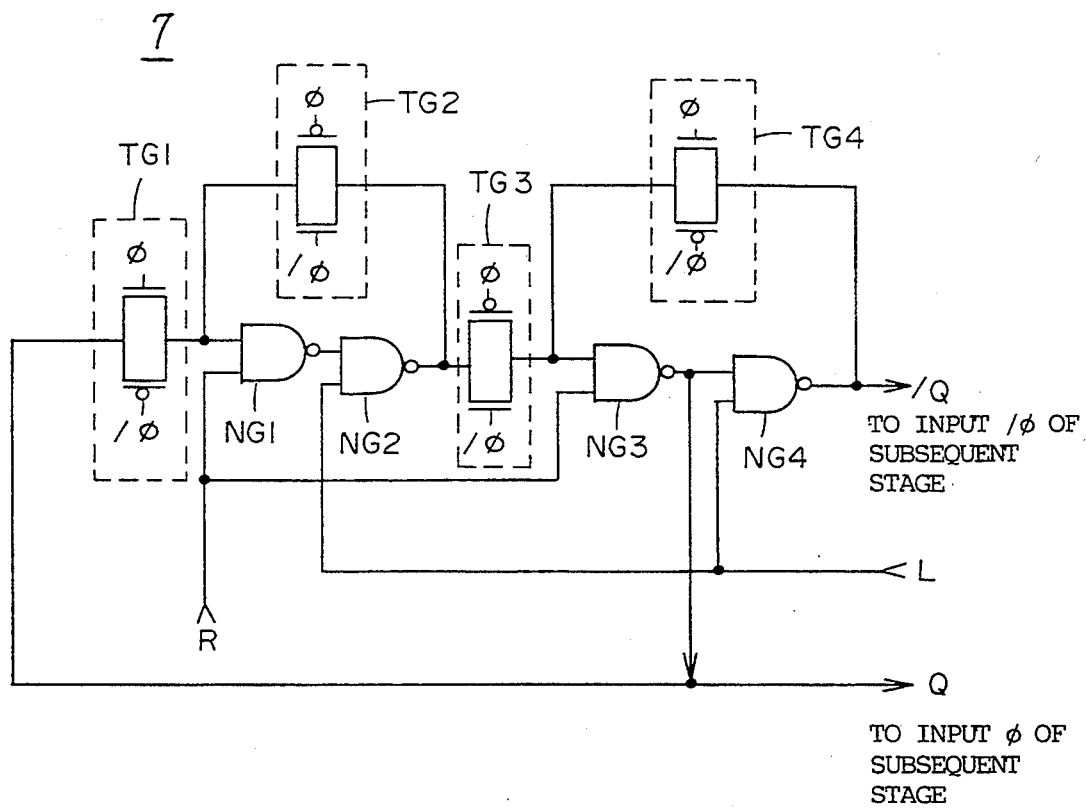
FIG. 6 shows a construction of a binary counting circuit shown in FIG. 4.

FIG. 6 shows an example of a specific construction of the binary counting circuit shown in FIG. 4. In FIG. 6, a binary counting circuit 7 (generically representing each of binary counting circuits 7-0−7−(n−1)) is formed of a master slave flip-flop. At a master stage, there are provided a CMOS (complementary MOS) transmission gate TG1 which becomes conductive in response to the rising of clock signal φ, an NAND circuit NG1 which has one input for receiving an output of transmission gate TG1 and the other input for receiving a reset signal R, an NAND circuit NG2 which receives load signal L and an output of NAND circuit NG1, and a CMOS transmission gate TG2 which is responsive to the falling of clock signal φ to feed back an output of NAND circuit NG2 to the one input of NAND circuit NG1.

At a slave stage, there are provided a CMOS transmission gate TG3 which becomes conductive to transmit the output of NAND circuit NG2 in response to the falling of clock signal φ, an NAND circuit NG3 which has one input for receiving an output of transmission gate TG3 and the other input for receiving reset signal R, an NAND circuit NG4 which receives load signal L and an output of NAND circuit NG3, and a CMOS transmission gate TG4 which is responsive to falling of clock signal φ to feed back an output of NAND circuit NG4 to the one input of NAND circuit NG3. NAND circuit NG3 generates the output Q, and NAND circuit NG4 generates the complementary output /Q. The output of NAND circuit NG3 is also transmitted to the input of transmission gate TG1.

In binary counting circuit 7 shown in FIG. 6, transmission gates TG1 and TG4 simultaneously become conductive. Also, transmission gates TG2 and TG3 simultaneously become conductive. Transmission gates TG1 and TG2 complementarily becomes conductive. An operation will be described below.

In the normal operation, both of reset signal R and load signal L are "H". In this condition, NAND circuits NG1, NG2, NG3 and NG4 operate as inverter circuits. While clock signal φ is "H", transmission gates TG1 and TG4 are conductive, and transmission gates TG2 and TG3 are nonconductive. In this condition, the output Q is transmitted to the output of NAND circuit NG2 through transmission gate TG1. Output /Q is fed back to the above one input of NAND circuit NG3 through transmission gate TG4. Therefore, outputs Q and /Q do not change in this condition.

When clock signal falls to "L", transmission gates TG1 and TG4 become nonconductive, and transmission gates TG2 and TG3 become conductive. Thus, NAND circuit NG2 supplies the output (output Q) to NAND circuit NG3 through transmission gate TG3. NAND circuit NG3 operates as the inverter circuit in this state, so that the output Q is inverted. Meanwhile, the output of NAND circuit NG2 is fed back to the one input of NAND circuit NG1 through transmission gate TG2, so that the master stage enters a latched state.

As described above, whenever the clock signal φ falls, the state of output Q changes. Outputs Q and /Q are transmitted to the binary counting circuit at the next stage in response to clock signals φ and /φ. In this manner, the counting operation described previously is performed.

Figure 7:
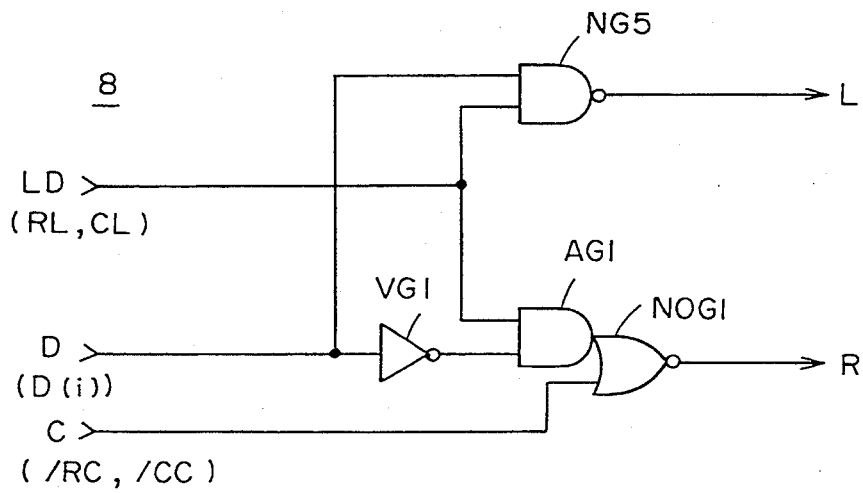
FIG. 7 shows a construction of a reset/load circuit shown in FIG. 4.

FIG. 7 shows a construction for generating the reset signal R and load signal L which are used to set the initial value of the binary counting circuit shown in FIG. 6. Reset/load circuit 8 shown in FIG. 7 represents construction of one of reset/load circuits 8-0−8(n−1) shown in FIG. 4. In FIG. 7, the reset/load circuit 8 includes an inverter circuit VG1 for receiving preload data D, an AND circuit AG1 for receiving an output of inverter circuit VG1 and a load instruction signal LD (RL, CL), a NOR circuit NOG1 which receives a reset signal C (/RC, /CC) and an output of AND circuit AG1, and a NAND circuit NG5 for receiving the load instruction signal LD and preload data D.

Figure 8:
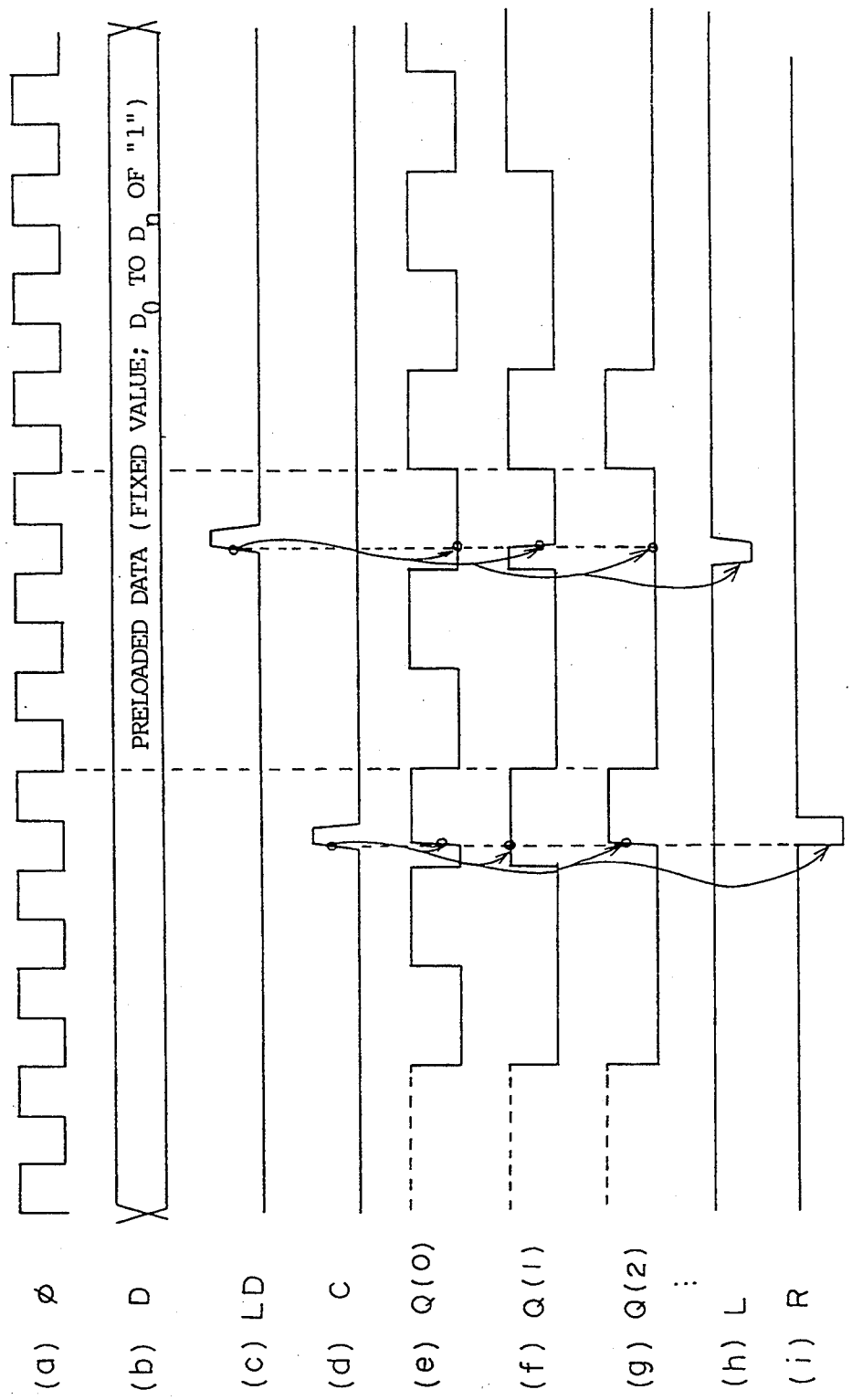
FIG. 8 is a signal waveform diagram showing operations of circuits shown in FIGS. 6 and 7.

Now, operations of circuits shown in FIGS. 6 and 7 will be described below with reference to waveform diagrams of FIG. 8. First, a reset operation of binary counting circuit (FIG. 6) will be described. If the reset operation is performed while counting circuit 7 is performing the counting operation on the clock signals φ, reset signal C initially goes to "H". Thereby, reset signal R generated by NOR circuit NOG1 goes to "L". Since load instruction signal LD is "L", load signal "L", i.e., the output of NAND circuit NG5 is "H". In this case, the outputs of NAND circuits NG1 and NG3 (FIG. 6) go to "H", and the outputs of NAND circuit NG2 and NG4 go to "L". This state is set independent of the state of clock signal φ and is maintained while the clock signal φ is "H". At a time at which clock signal φ falls to "L", "H" (logic "1") of this output Q changes to "L" (logic "0 ").

All the reset operations of binary counting circuit 7 described above are simultaneously performed in the counter 700. Therefore, all outputs Q(0)−Q(n−1) supplied from counter 700 are set at "H" in response to the reset signal "C". By setting all outputs Q(0)−Q(n−1) of counter 700 at "1" in response to reset signal "C", the counts of binary counter 700 can be 16, i.e., $2^n$, as shown in FIG. 9.

Figure 9:
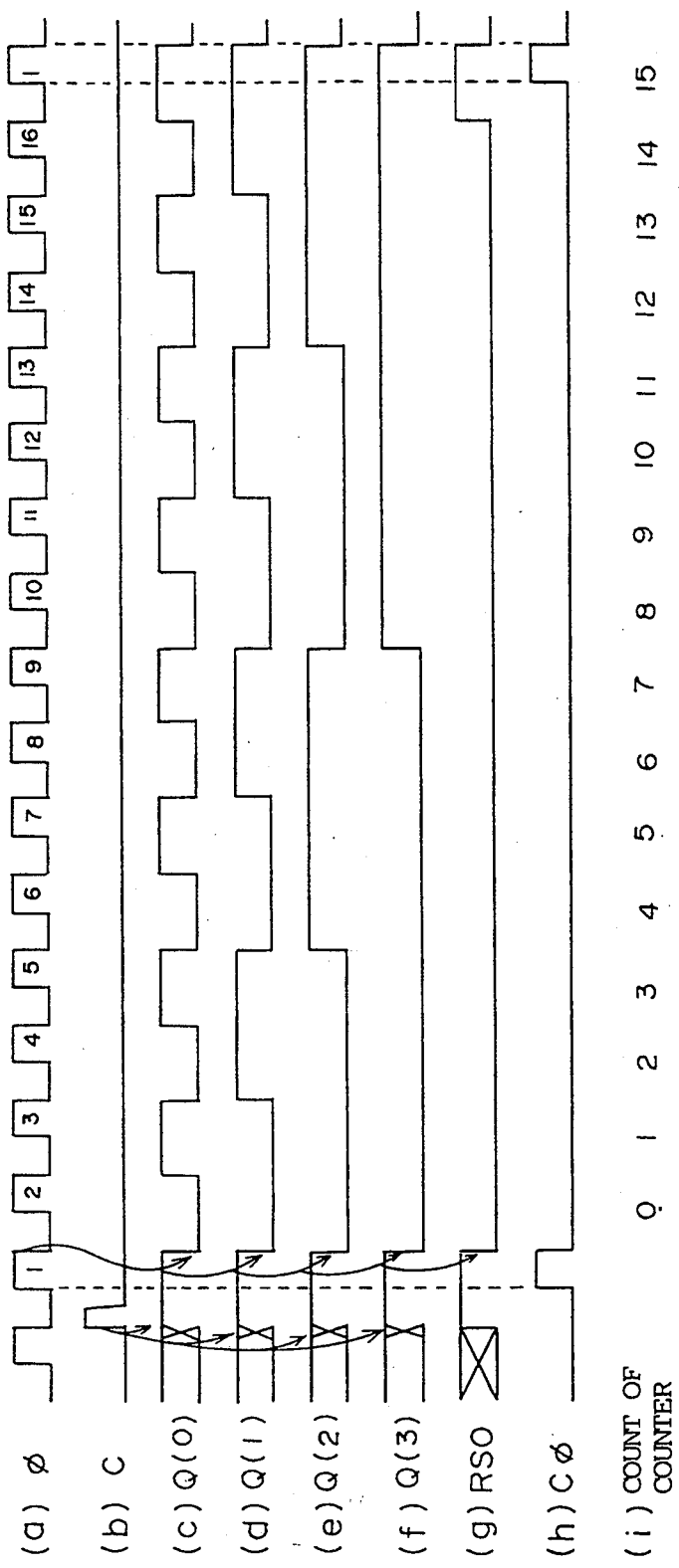
FIG. 9 is a signal waveform diagram showing operations after resetting a binary counting circuit shown in FIG. 4.

In FIG. 9, binary counter 700 is shown having the output of 4 bits. When reset signal C is generated, all outputs Q(0)−Q(3) go to "1", and output RSO of AND circuit 51 receiving the output from row counting circuit 5 goes to "H". Also, output Cφ of AND circuit 52 goes to "H". Thereby, the initial values of row and column address pointers 2 and 3 can be set at RO(0) and CO(0), respectively, and the 0th row and 0th column in memory cell array 4 are selected in response to the falling of the clock signal φ.

Returning to FIG. 8, description will be made with respect to an operation for setting preload data D in a corresponding binary counting circuit. It is assumed that preload data D is "1" (level "H"). When data is to be preloaded, load instruction signal LD is generated. In this case, load instruction signal L falls to "0". Meanwhile, reset signal R is at a level of "H" (both the outputs of inverter circuit VG1 and AND circuit AG1 are "0"), because reset signal C is "L". In this case, the outputs of NAND circuits NG2 and NG4 contained in binary counting circuit 7 go to "1". In accordance with the state of clock signal $\phi$, one of transmission gates TG3 and TG4 becomes conductive. NAND circuits NG1 and NG3 operate as the inverter circuits in this condition. Therefore, when load instruction signal LD is generated, the output of binary counting circuit Q goes to "L" independently of the states of transmission gates TG3 and TG4. When clock signal $\phi$ falls to "L" thereafter, the state of output "Q" changes, and the output Q of binary counting circuit 7 goes to "1".

If preload data "D" is 0, the L output of NAND circuit NG5 contained in reset/load circuit 8 is "1", so that the operation similar to the resetting operation is performed, and thus the output Q of binary counting circuit 7 rises to "1" in response to load instruction signal LD. Further, the output Q changes to "0" in response to the next falling of clock signal $\phi$.

As described above, provision of the preset function for setting the preload data in the row and column counting circuits enables the clock counts of row and column counting circuits to be coincide with the numbers of rows and columns in the memory cell array, respectively. Therefore, the address pointer can sequentially select the rows and columns in the memory cell array having an arbitrary construction at high speed.

Figure 10:
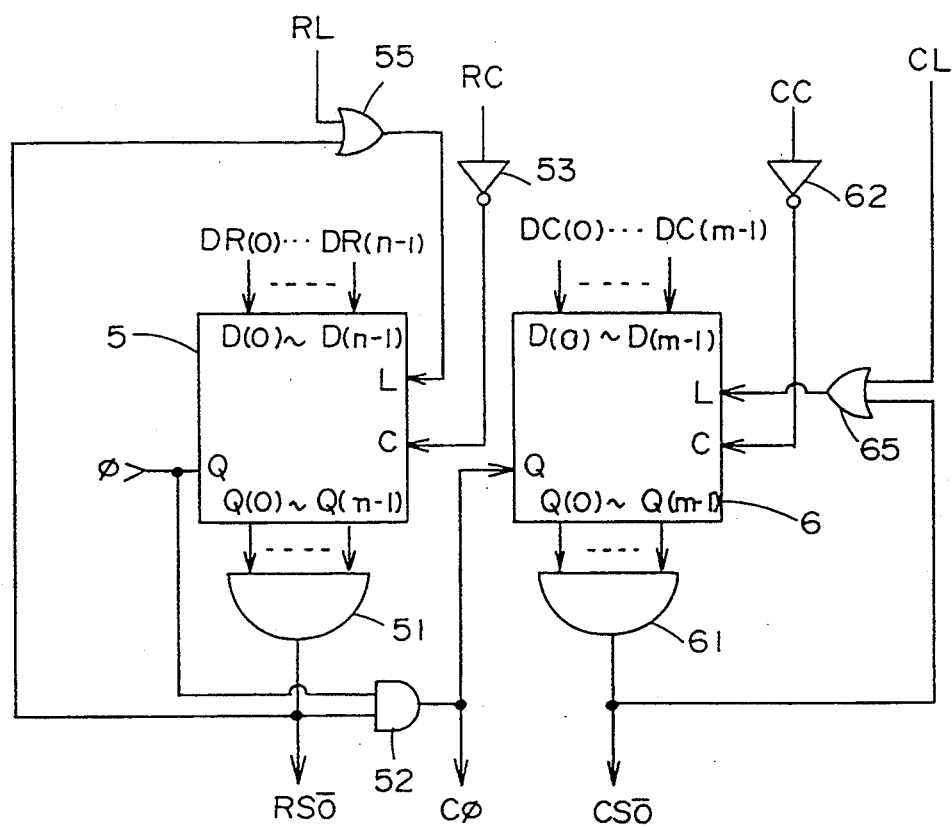
FIG. 10 shows another example of a construction of a counting circuit shown in FIG. 2.

The preload data may be set in a fixed manner by a fuse element or bonding wire, and also may be set in a storing device such as a register by a control device (not shown). Preload data D sets the initial count values of the row and column counting circuits. Row (column) counting circuit 5 (6) performs the counting from the preload value to the maximum count. In this case, row (count) circuit 5 (6) is required to be reset to the preload value at each cycle of the counting operation. If row (column) counting circuit 5 (6) is formed of a asynchronous counter as shown in FIGS. 4 and 6, only the output state of each binary counting circuit 7 changes in response to the change of the clock signal, so that load instruction signal L must be generated at each cycle of the counting operation, in order to return to the preload value. FIG. 10 shows a construction for generating the load instruction signal at each cycle of the counting operation.

In FIG. 10, counter 1 includes, in addition to the construction shown in FIG. 2, an OR circuit 55 for receiving the row preload signal RL and the column count coincidence signal RSO, and an OR circuit 65 for receiving the row preload instruction signal CL and the column count coincidence signal CSO. An output of OR circuit 55 is applied to the load input L of row counting circuit 5. An output of OR circuit 65 is applied to the load input L of column counting circuit 6. In this construction, the count of row (column) counting circuit 5 (6) is reinitialized to the preload value each time the preloading is conducted or the row (column) count coincidence signal RSO (CSO) is generated. Due to this construction, even if the asynchronous binary counter is used, presetting of the initial value can be ensured, and the number of count-up can be set at an arbitrary value.

Figure 11:
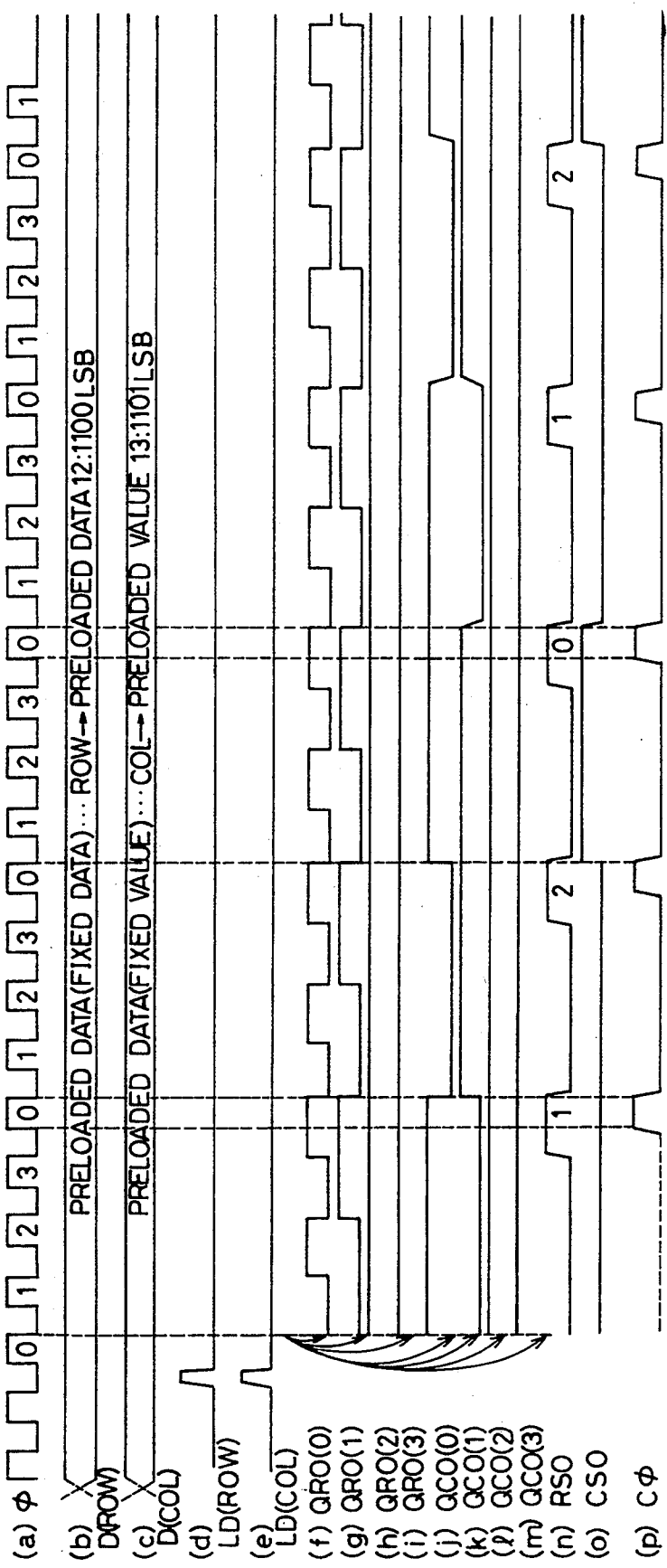
FIG. 11 is a signal waveform diagram showing an operation of a counting circuit in FIG. 10 during preloading.

FIG. 11 shows operation waveforms relating to the operation in which a preload data is preloaded in the counter 1. In FIG. 11, row and column counting circuits 5 and 6 include output nodes of 4 bits, and their preload values are set at "1100" (12 in decimal notation) and "1101" (13 in decimal notation), respectively. Also in FIG. 11, the outputs of row counting circuit 5 are indicated by QRO(0)−QRO(3), and the outputs of column counting circuit 6 are indicated by QCO(0)−QCO(3). The least significant bits of row and column counting circuits 5 and 6 are QRO(0) and RCO(0), respectively. An operation will be described below with reference to FIGS. 10 and 11.

Row and column counting circuits 5 and 6 include outputs QRO(0)−QRO(3) and QCO(0)−QCO(3) of 4 bits, respectively. In this case, the maximum counts of row and column counting circuits 5 and 6 are "1111". The preload data of "1100" is set in the row counting circuit 5 and the preload data of "1101" is set in the column counting circuit 6. In this case, the output data of row and column counting circuits 5 and 6 become equal to the preload data in response to the falling of the first clock signal $\phi$ after the load signal LD. Row counting circuit 5 is initialized to the preload data each time four clocks are counted. Thereby, the counting circuit having the count number of 4 can be obtained using the row counting circuit having the 4-bit outputs.

In column counting circuit 6, the output data is initialized to the preload data each time three row count coincidence signals RSO of the row counting circuit are counted, so that the construction can sequentially access the rows and columns in the memory cell array of four rows and three columns.

In the above description, preload signal LD and reset signals RC and CC are generated at the different timings. However, they may be generated at the same timing.

Figure 12:
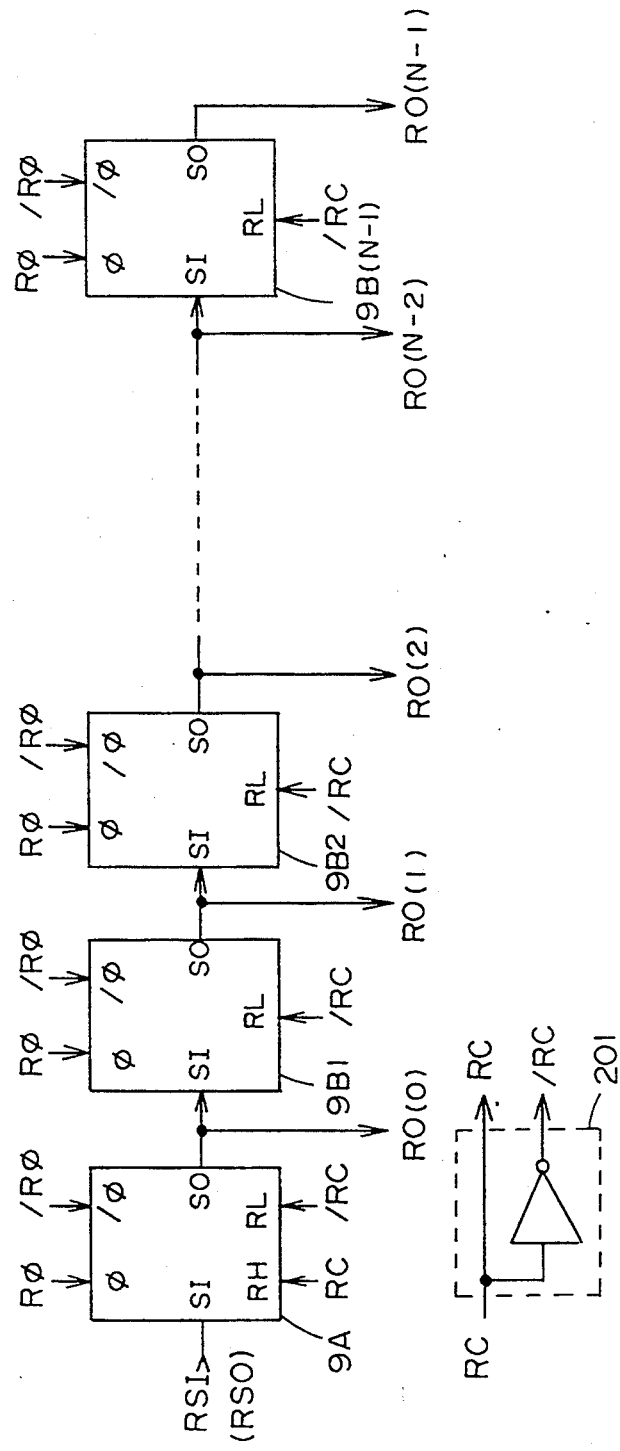
FIG. 12 shows a construction of a row (column) address pointer in FIG. 1.

Now, specific constructions of the row and column address pointers 2 and 3 will be described below. Row and column address pointers 2 and 3 have the same constructions. FIG. 12 is a block diagram showing an overall construction of the row address pointer. The row address pointer shown in FIG. 12 includes shift registers 9A and 9B1−9B(N−1) which are cascadedly connected in N stages. The inputs SI of shift register 9A at the first stage receive the row count coincidence signal RSO from row counting circuit 5 through an input node RSI. Output SO of the shift register at the final stage generates a row selecting signal RO(N−1). A feed back path is not provided between the output of the shift register 9B(N−1) at the final stage and the input SI of shift register 9A at the first stage.

Row address pointer 2 further includes a clock buffer 200 which produces internal shift clocks R$\phi$ and /R$\phi$ of two phases from the shift clock signal R$\phi$ ($\phi$), and a buffer circuit 201 which produces internal complementary reset signals RC and /RC from reset signal RC. Shift register 9A at the first stage receives reset signals RC and /RC at its reset inputs RH and RL. Shift registers 9B1−9B(N−1) receive reset signals /RC at their reset inputs RL. Shift registers 9A and 9B1−9B(N−1) perform the shifting operation in response to clock signals R$\phi$ and /R$\phi$.

Figure 13:
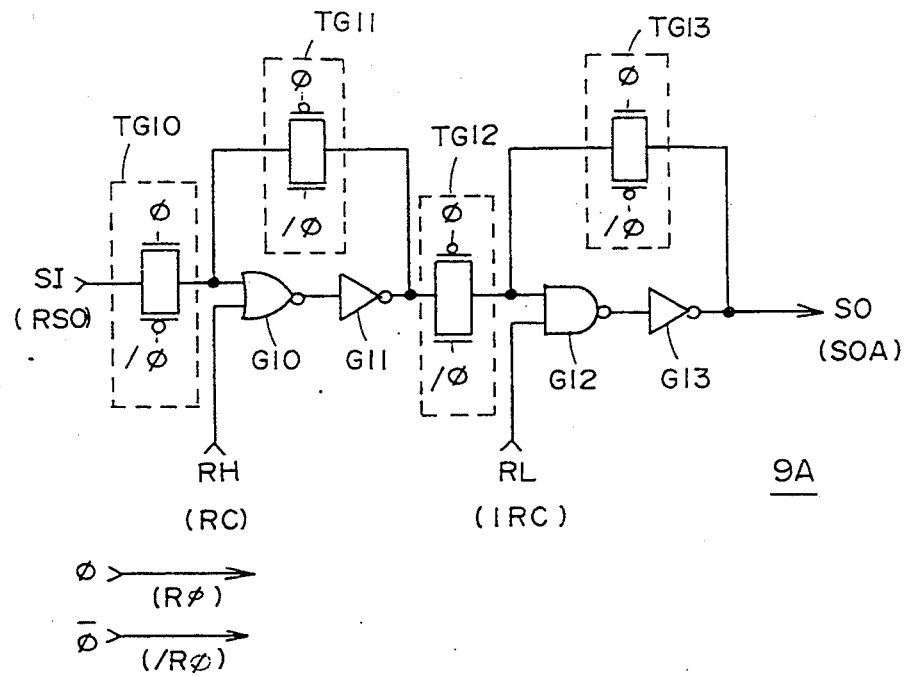
FIG. 13 shows a construction of a shift register at a first stage shown in FIG. 12.

FIG. 13 shows a construction of shift register 9A at the first stage in the row address pointer shown in FIG. 12. Column address pointer 3 includes shift register 9A shown in FIG. 13 serving as the shift register at the first stage. Referring to FIG. 13, the first shift register 9A includes a CMOS transmission gate TG10 which is responsive to clock signal $\phi$(R$\phi$) to become conductive for passing the row count coincidence signal RSO applied to the input node SI, a NOR circuit G10 which has one input for receiving an output of transmission gate TG10 and the other input for receiving the reset signal RC through node RH, an inverter circuit G11 which inverts the output of NOR circuit G10, and a CMOS transmission gate TG11 which feeds back the output of inverter circuit 11 to the one input of NOR circuit G10.

Shift register 9A further includes a CMOS transmission gate TG12 which transmits the output of inverter circuit G11 in response to the falling of clock signal φ, an NAND circuit G12 which has one input for receiving an output of transmission gate TG12 and the other input for receiving the complementary reset signal /RC through input node RL, an inverter circuit G13 which inverts an output of NAND circuit G12, and a CMOS transmission gate TG13 which is responsive to the rising of clock signal φ to transmit the output of inverter circuit G13 to the one input of NAND circuit G12. Output SO (SOA) is generated from inverter circuit G13 to be applied to the shift register at the next stage.

CMOS transmission gates TG10 and TG13 simultaneously become conductive, and CMOS transmission gates TG11 and TG12 simultaneously become conductive. CMOS transmission gates TG10 and TG11 complementarily become conductive.

Figure 14:
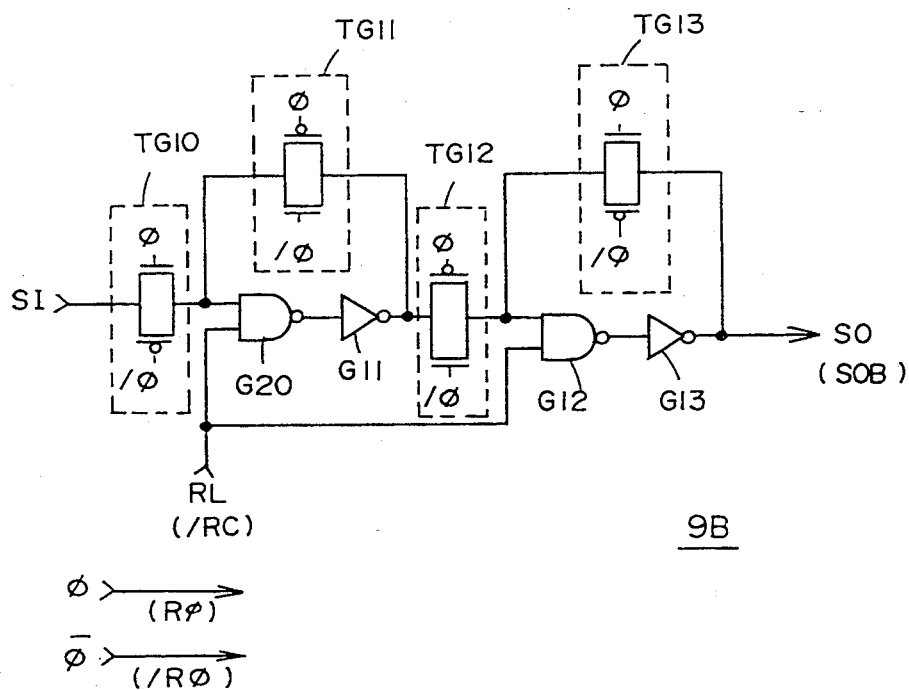
FIG. 14 shows a construction of a shift register at a second or subsequent stage shown in FIG. 12.

FIG. 14 shows a construction of shift register 9B at the second and subsequent stages in row address pointer 2 shown in FIG. 12. Shift register 9B shown in FIG. 14 is employed in column address pointer 4 as each of shift registers at the second and subsequent stages. Shift register 9B has the construction similar to that shown in FIG. 13 except that the NOR circuit G10 is replaced with NAND circuit G20 which receives the signal /RC as the reset signal through node RL. In FIG. 14, portions corresponding to the components of the shift register in FIG. 13 bear the same reference numbers. The operation of the shift register shown in FIGS. 13 and 14 will be described below with reference to the waveform diagrams of FIGS. 13 and 15. First, the normal operation, i.e., shift operation will be described.

While the clock signal φ is "H", transmission gates TG10 and TG13 are conductive and transmission gates TG11 and TG12 are nonconductive. In the normal operation, the signal RC applied to node RH is at "L" level, and the signal /RC applied to node RL is at "H" level. Both of NOR circuits G10 and NAND circuit G12 operate as the inverter circuits. In this case, the signal applied to input node SI is transmitted to the output of inverter circuit G11. Output SO is fed back to the one input of NAND circuit G12 through transmission gate TG13. Therefore, the output state does not change in this condition.

When clock signal φ falls to "L", transmission gates TG10 and TG13 become nonconductive, and transmission gates TG11 and TG12 become conductive. In this condition, the output of inverter circuit G11 is passed as the output SO through transmission gate TG12, NAND circuit G12 and inverter circuit G13. The output of inverter circuit G11 is also applied to the one input of NOR circuit G10 (or NAND circuit G20) through transmission gate TG11. Thereby, the output of inverter circuit G11 is kept in a latched state, and the signals, which are applied to the input SI while clock signal φ is continuously "H", are output. Thus, the shift register shown in FIGS. 13 and 14 is responsive to the rising of clock signal φ to take in the signal applied to the input node SI, which will be output in response to the falling of clock signal φ. Reset operation will be described below.

Figure 15:
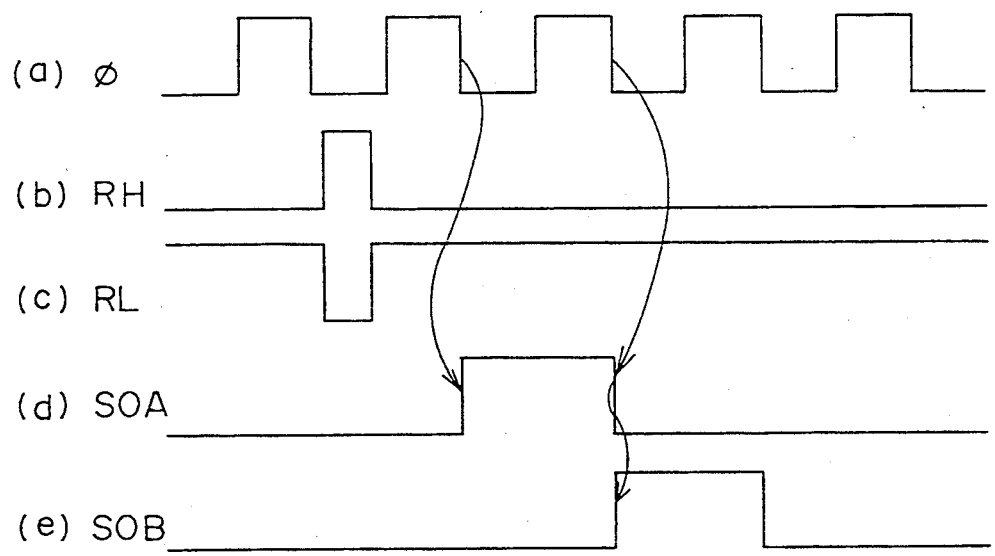
FIG. 15 is a signal waveform diagram showing an operation of a shift register shown in FIG. 14.

In the reset operation, the signal RC applied to node RH goes to "H", and the signal /RC applied to node RL goes to "L", as shown in FIG. 15. In this condition, the output of NAND circuit G12 is "H", and outputs SO (SOA and SOB) are "L". The output of NOR circuit G10 is "L" and the output of inverter circuit G11 is "H".

Meanwhile, in shift register 9B at the second and subsequent stages, the output of NAND circuit G20 is "H", and the output of inverter circuit G11 is "L". This state is set in response to reset signals RC and /RC, independently of the state of clock signal φ. When clock signal φ goes to "H", this state is maintained by NAND circuits G12 and G13 and transmission gate TG13 at the output stage, and the output state thereof maintains the reset state. When clock signal φ falls, the output of gate circuit G11 is transmitted to the one input of NAND circuit G12. In this operation, reset signals RC and /RC have already been asserted to the steady state. Thus, output SOA of the first shift register 9A is "H" (logic "1"), and the output of shift registers 9B at the second and subsequent stages go to "L" (logic "0") in accordance with the output of NAND circuit G20. Output SOA of the first shift register 9A is passed to input SI of next shift register 9B1. In the shift registers 9B at the second and subsequent stages, transmission gates TG10 take in and latch the signals applied to the respective input nodes SI in response to the rising of clock signal φ to "H". In this case, the signal of "H", therefore, is maintained only in the shift register 9B1 at the second stage. Then, in response to the falling of clock signal φ, second shift register 9B1 outputs the latched signal of "H". Thereafter, the above operation will be sequentially repeated so that outputs RO(1), ... RO(N−1) of the address pointer will be sequentially set at the activated level of "H".

In the above embodiment, the output states of row address pointer 2, column address pointer 3, row counting circuit 5 and column counting circuit 6 change in response to the falling of clock signals φ (Rφ, Cφ). Alternatively, such a construction may be employed that the output state of these circuits changes in response to the rising of clock signals φ. This construction is realized by inverting polarities of the clock signals applied to the respective transmission gates.

Although row and column counting circuits 5 and 6 perform the count-up operations in the above embodiment, they may be constructed to perform count-down operations.

Further, in the above embodiment, all the output states of row and column counting circuits are temporarily set at the initial states of "H" when the reset signals RC and CC are generated. In this case, the shift clock signal may be generated to be applied to the column counting circuits in the initial setting operation. However, in the preloading operation, the clock signal φ (Cφ) may not be applied to the column counting circuit, depending on the preload data. In this case, such a construction may be employed that there is provided a gate circuit passing the clock signal φ in response to a one-shot pulse, which is generated in response to the load signal, and an signal, which is formed by OR processing of an output of the above gate circuit and the output of the AND circuit 52 shown in FIG. 2, is applied to the clock inputs φ of column counting circuit 6. In this case, shift clock signals Cφ (and φ) can be surely applied to the column counting circuit, and the output state thereof can be set at a desired state in response to the falling of this clock signal φ.

In the embodiment described above, a counter (asynchronous binary counter) is employed for generating a drive signal driving the first stage shift register in the row and column address pointers. However, another construction can be used for driving the row and column address pointers without a binary counter.

FIG. 16 shows an overall construction of a memory device according to another embodiment of the present invention. Referring to FIG. 16, the memory device includes a row address pointer 302 responsive to a row shift clock signal R$\phi$ for sequentially driving the word lines in the memory cell array 4, a row pointer driver 304 responsive to the row shift clock signal R$\phi$ for drive the row address pointer 302. The row address pointer 302 includes cascaded N shift registers corresponding to respective rows in the memory cell arrays. The row pointer driver 304 has the same construction as the row address pointer 304 except that the driver 304 has not output node for driving the word lines. The shift-in node SI and the shift-out node SO of the driver 304 are connected to the shift-out node SO and the shift-in node SI of the pointer 304. The driver 304 and the pointer 302 form a recirculating ring pointer. Upon initialization, only the first stage shift registers of the driver 304 and the pointer 302 are initialized to "1".

The memory device further includes a column address pointer 306 responsive to a column shift clock signal C$\phi$ for sequentially selecting the columns in the memory cell array 4, and a column pointer driver 308 responsive to the column shift clock signal C$\phi$ for driving the column address pointer 308. The driver 308 and the pointer 306 have the similar construction to each other and each includes cascaded M shift registers. The driver 308 has a shift-in node SI and a shift-out node SO connected, respectively, to a shift-out node SO and a shift-in node SI of the pointer 306.

The driver 308 and the pointer 306 form a recirculating shift register. Upon initialization, only the first stage shift registers in the driver 308 and the pointer 306 are initialized to "1".

The row shift clock signal R$\phi$ is produced by a buffer 310 including cascaded inverters from a clock signal $\phi$, and the column shift clock signal C$\phi$ is generated from a frequency-divider 312 which frequency-divides the clock signal $\phi$ by the factor of N.

Figure 17A:
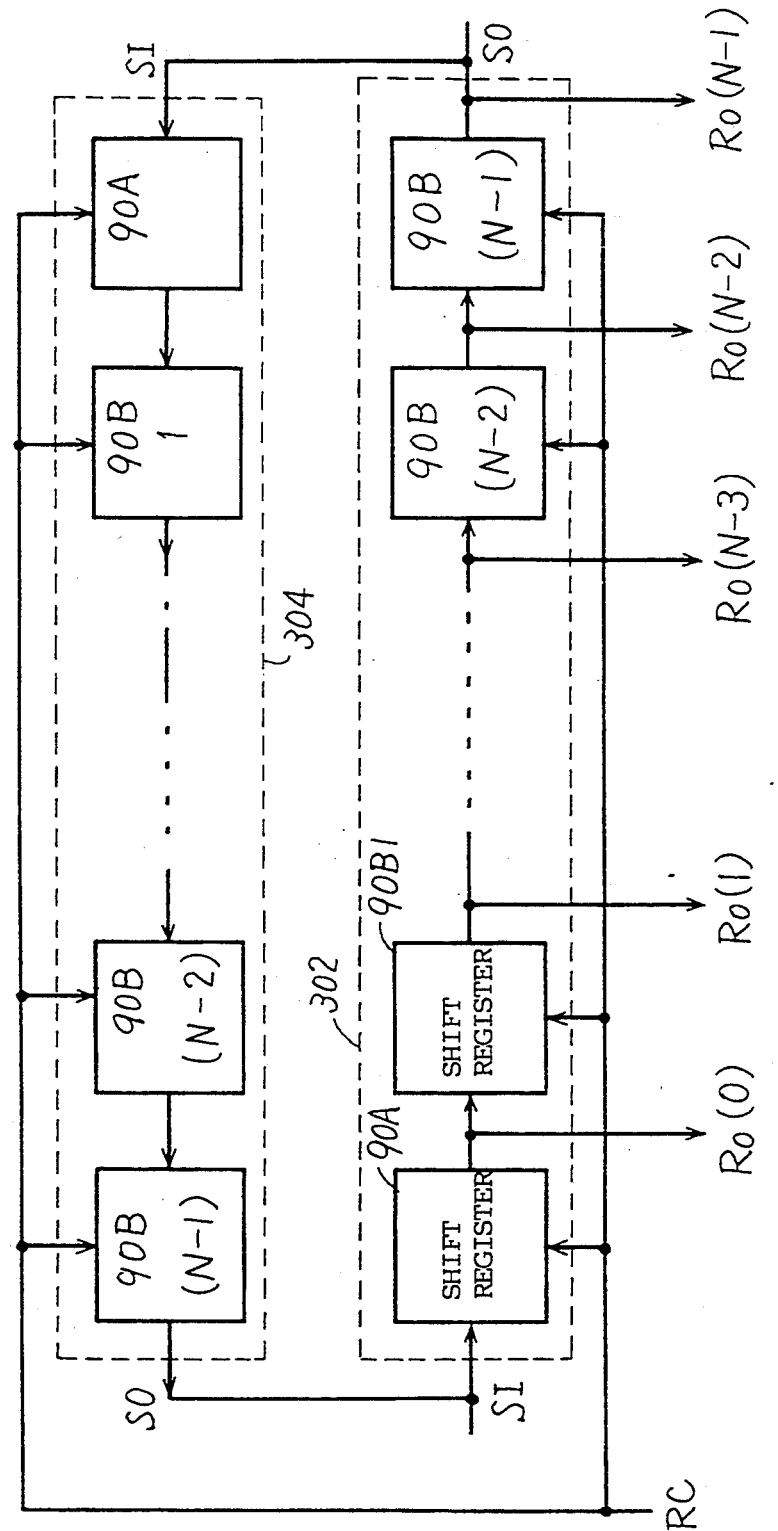
FIGS. 17A through 17C show specific constructions of the pointer and the pointer driver shown in FIG. 16.

FIG. 17A shows a specific configuration of the row pointer driver and the row address pointer. Referring to FIG. 17A, the row address pointer 302 includes a shift register 90A and shift registers 90B1 through 90B(N−1) which are cascaded and drive the rows Ro (0) through Ro (N−1), respectively. The row pointer driver 304 similarly includes the shift register 90A and the shift registers 90B1 through 90B(N−1) which are cascaded. The output of the final stage shift register 90B(N−1) of the pointer 302 is supplied to the input of the first stage shift register 90A of the driver 304. The first stage shift register 90A of the pointer 302 receives the output of the final stage shift register 90B(N−1) of the driver 304. The column address pointer 306 and the column pointer driver 308 have the same consturction as shown in FIG. 17A except that the number of the shift register stages is M instead of N.

Figure 17B:
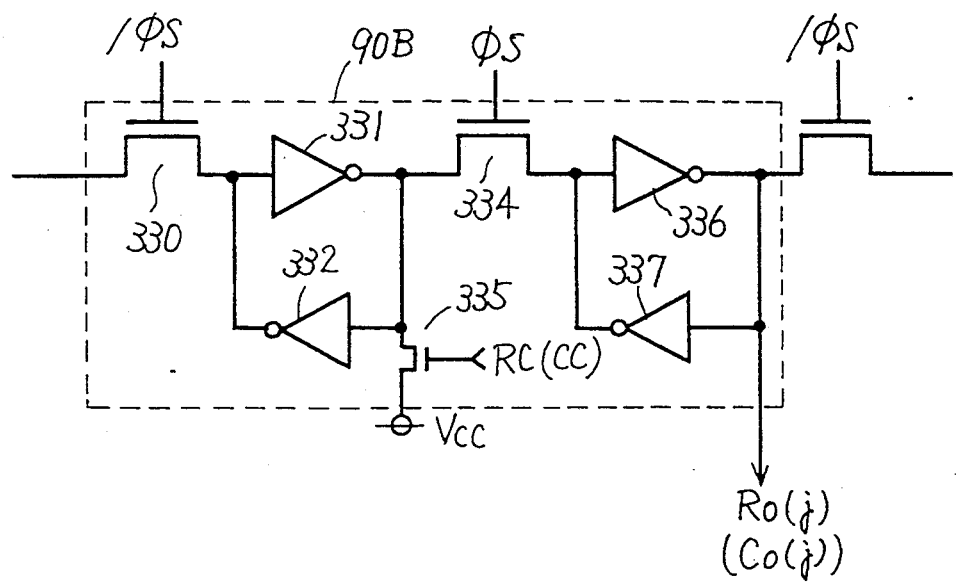

FIG. 17B shows a construction of the shift register used in the second through final stage in the circuitry shown in FIG. 17A. Referring to FIG. 17A, the shift register 90B (representatively showing the registers 90B1 through 90B(N−1) or 90B(M−1) includes a transmission gate 330 responsive to a shift clock signal /$\phi$S (corresponding to the signal /R$\phi$ or /C$\phi$), inverters 331 and 332 for latching an output of the transmission gate 330, and a reset switch 335 responsive to the reset signal RC (or CC) for resetting the output node of the inverter 331 to "H".

The shift register 90B further includes a transmission gate 334 responsive to a clock signal $\phi$S (corresponding to the signals R$\phi$ and C$\phi$) for transmitting the output of the inverter 331, and inverters 336 and 337 for latching an output of the transmission gate 334. The inverter 336 drives a row Ro(j) or a column Co(j) when the shift register 90B is employed in the row or column address pointer. If the shift register 90B is used in the pointer drives 304 or 308, the inverter 336 is not required to drive a row or a column and therefore no signal line for driving a row or a column is provided in this case.

Figure 17C:
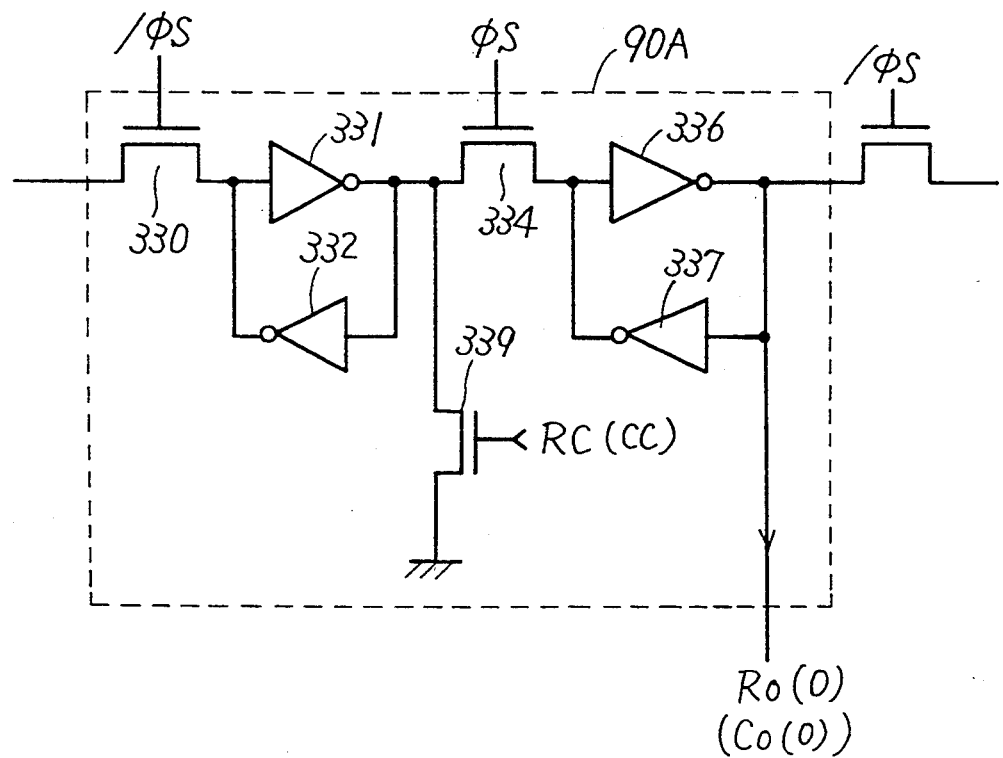

The shift register 90B latches an applied signal in response to the fall of the clock signal $\phi$S, and outputs the latched signal in response to the rise of the clock signal $\phi$S. FIG. 17C shows a construction of the first stage shift register in the circuiting shown in FIG. 17A. Referring to FIG. 17C, the first stage shift register 90A has the same construction as the shift register 90B of FIG. 17B except that the reset switch 39 of the shift register 90A resets the output node of the inverter 331 to "L" in response to the reset signal RCC (or CC).

Figure 18:
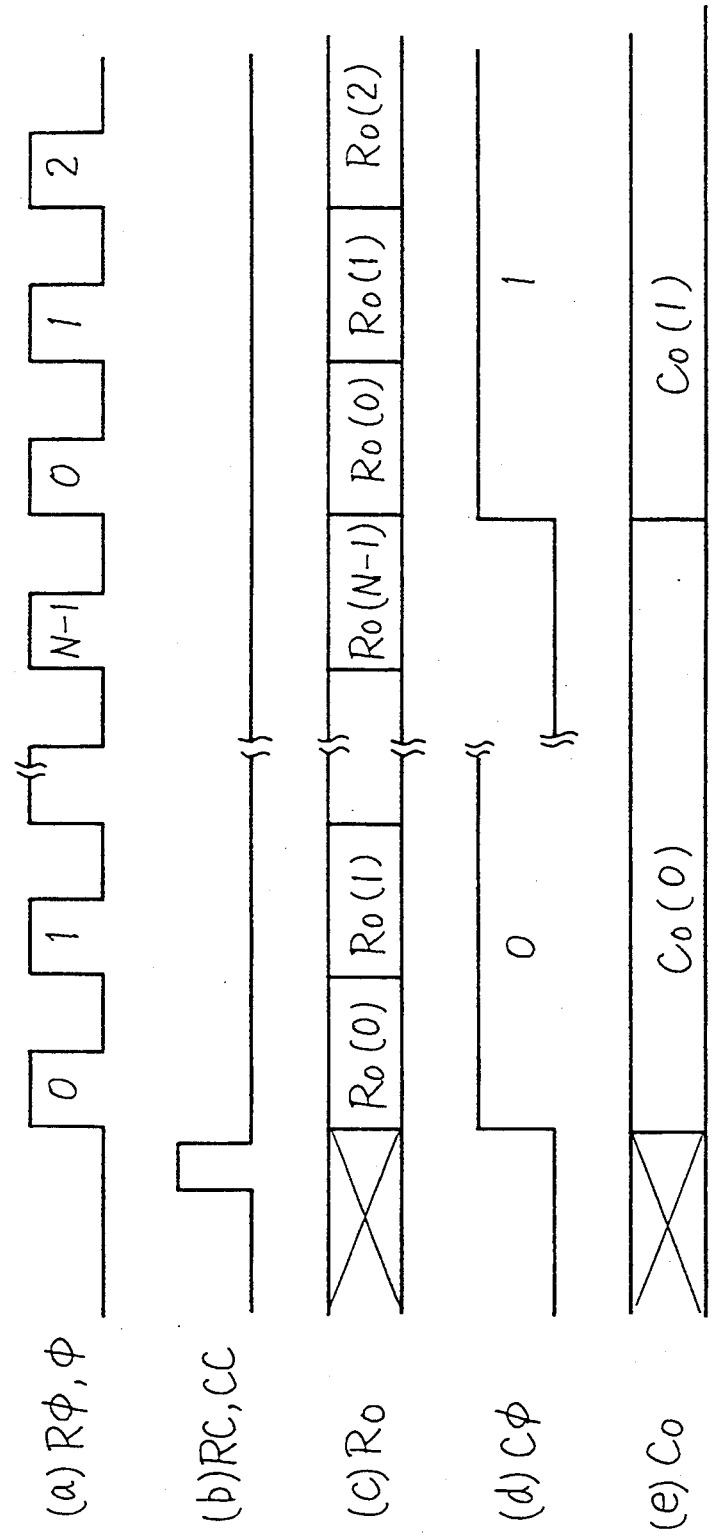
FIG. 18 is a waveform diagram showing the operations of the circuits shown in FIGS. 17A through 17C.

FIG. 18 is a waveform diagram showing the operation of the circuits shown in FIGS. 17A through 17C. Now, an operation of the circuits shown in FIGS. 17A through 17C will be described with reference to FIG. 18.

In initialization, the reset signal RC and CC are generated to turn on the reset switches 335 and 339. The output nodes of the inverter 331 are reset to "H" and "L" in the shift registers 90B and 90A, respectively. In response to the next rise of the clock signal $\phi$, the shift clock signals R$\phi$ and C$\phi$ are generated to turn on the transmission gates 334, so that the first row Ro(0) and the first column Co(0) are driven into the selected state.

In response to the fall of the clock signal $\phi$, the signal R$\phi$ falls to turn on the transmission gate 330 and to turn off the transmission gate 334 in the row address pointer 302 and the row pointer driver 304, causing a shifting operation in the pointer 302 and the driver 304 with the outputs thereof unchanged. In response to the rise of the clock signal $\phi$, the row shift clock signal R$\phi$ rises to turn on the gate 334, so that the adjacent row Ro(1) is selected.

In the column address pointer 306 and the column pointer driver 308, the shift clock signal C$\phi$ maintains "H", so that the column Co(0) is maintained in the selected state. After the clock signal $\phi$ or R$\phi$ is generated N times, the row address pointer 302 receives "H" signal at the first stage shift register 90A from the final stage shift register 90B(N−1) of the driver 304 and vice versa.

In response to the (n+1)-th rise of the clock signal $\phi$ or R$\phi$, the first row Ro(0) is again selected, and the second column Co(1) is selected in response to the rise of the column shift clock signal C$\phi$. These operations are repeated until desired data are all written into or read out of the memory cell array 4.

FIGS. 19A through 19D illustrate the operations of the row address pointer and the row pointer driver. Now, operations will be described with reference to FIGS. 19A through 19D.

Figure 19A:
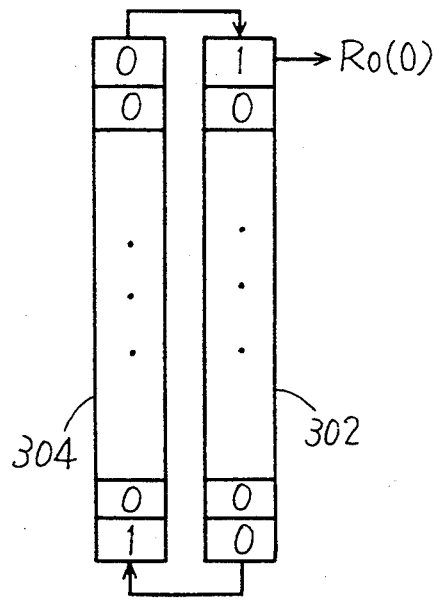
FIGS. 19A through 19D illustrate the operation of the pointer and the pointer driver shown in FIG. 16.

Referring to FIG. 19A, in the first cycle, the row address pointer 302 generates an active row drive signal Ro(0) from the first stage shift register.

Figure 19B:
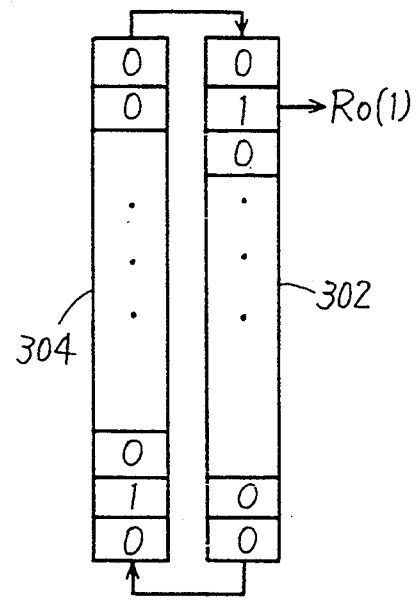

Referring to FIG. 19B, in the second cycle, the data "1" is shifted in the adjacent shift registers both in the row address pointer 302 and the row pointer driver 304. The second row Ro(1) is selected.

Figure 19C:
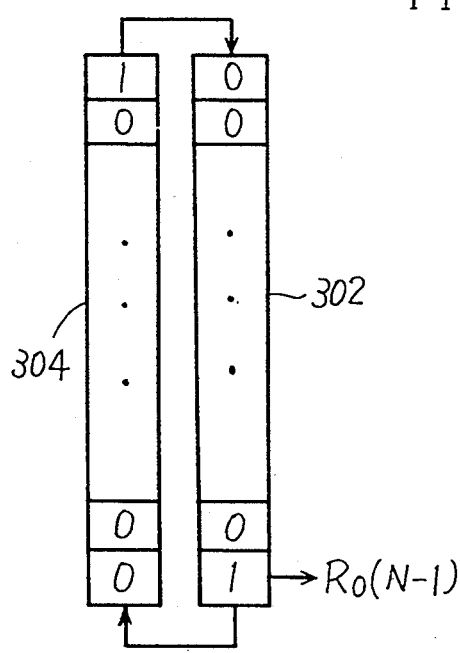

Referring to FIG. 19C, in the N-th cycle, the final stage shift registers in the row address pointer 302 and the row pointer driver 304 stores the data of "1". The Nth row Ro(N−1) is selected.

Figure 19D:
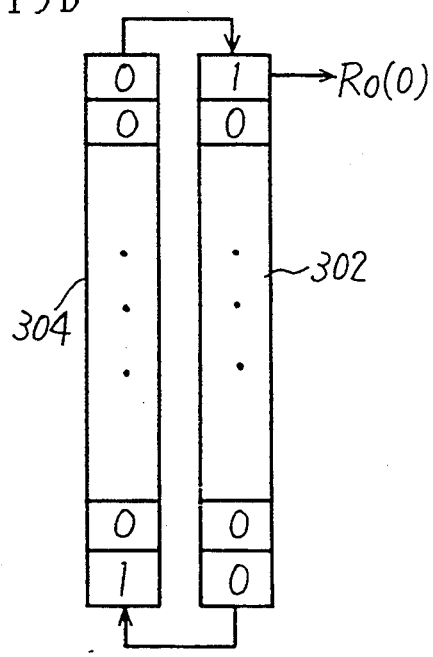
Figure 20:
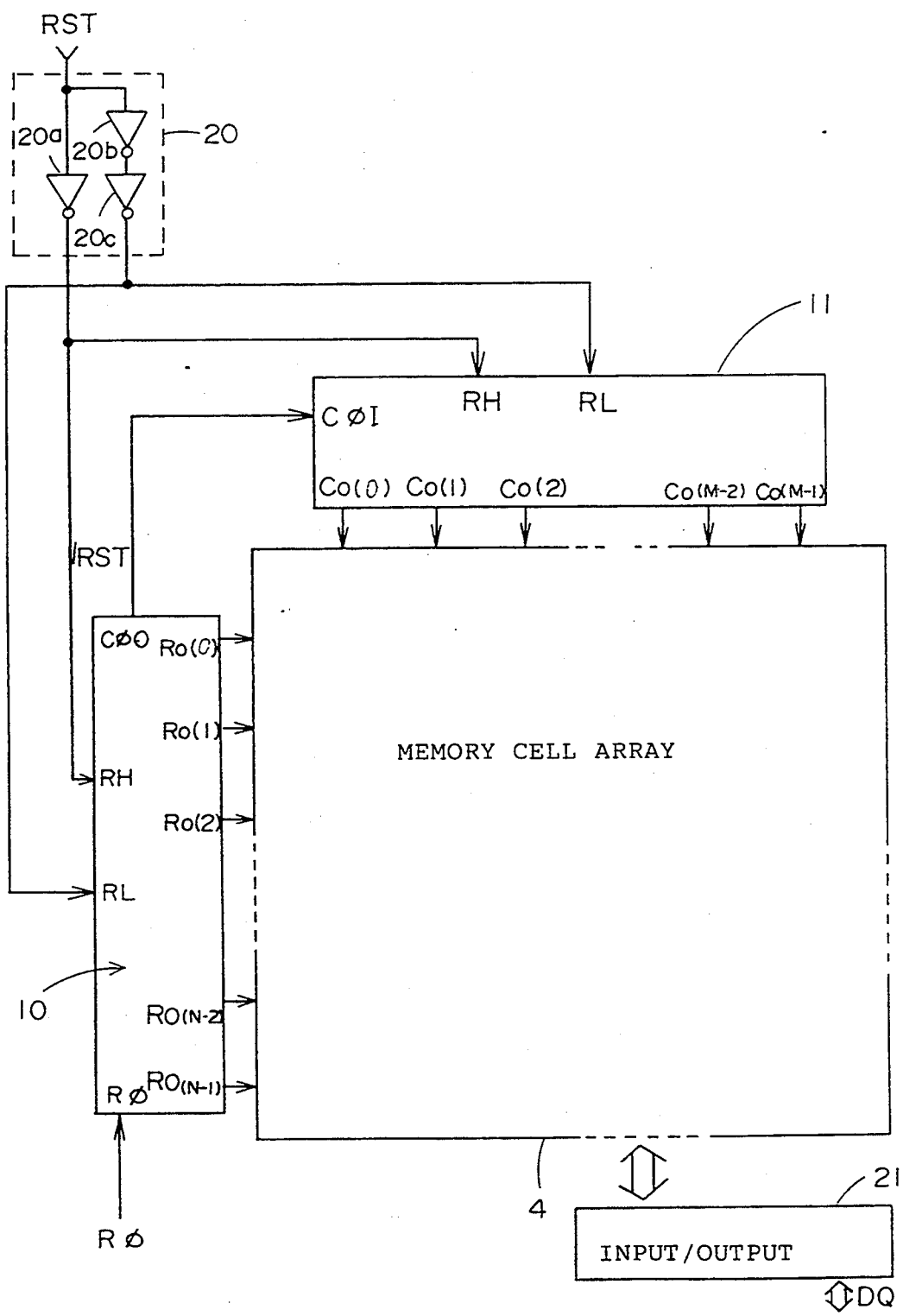
FIG. 20 schematically shows a whole construction of a conventional semiconductor memory device.

Referring to FIG. 19D, the data of "1" at the final stage shift register in the row address pointer 302 is transferred to the first stage shift register in the row pointer driver 304, and the data of "1" at the final stage shift register in the row pointer driver 304 is transferred to the first stage shift register of the row address pointer 302. The first row Ro(0) is again selected.

The operations illustrated in FIGS. 19A through 19D also hold for the operations of column selection.

According to the invention, as described hereinabove, the row count coincidence signal is generated when the count of the counting circuit coincides with the number of the rows in the memory cell array, and is sequentially shifted through the row address pointer, so that the rows in the memory cell array are respondently and sequentially set at the selected state, and thus the rows in the memory cell array can be selected at high speed without signal delay.

Since it is not necessary to feed back the output of the final stage in the row address pointer to the input stage thereof, the regularity of the components is not impaired, and the semiconductor memory device can have an improved area utilizing efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of generating a row select signal for selecting a row of memory cells in a memory cell array having a plurality of memory cells arranged in rows and at least a column, comprising the steps of:
    counting a clock signal;
    generating a count coincidence signal each time the number of counts of said clock signal becomes coincident with the number of rows; and
    in response to said clock signal, shifting said count coincidence signal to sequentially generate row select signals for setting associated row select lines in a selected state, and in which said shifting includes the step of receiving said count reach signal at a first stage of shift register stages corresponding to rows of the array to shift the count reach signal therethrough, and
    initializing said counting means responsive to said count coincidence signal.

2. A method according to claim 1, wherein said at least a column includes a plurality of columns and said memory cell array includes a plurality of column lines each connecting a column of memory cells, and wherein said method further includes the steps of
    in response to said count coincidence signal, passing said clock signal to generate a column shift clock;
    counting the column shift clock;
    generating the column count coincidence signal each time the number of counts of said column shift clock becomes coincident with the number of the column lines; and
    in response to said column shift clock, shifting said column count coincidence signal to sequentially generate column select signals for setting associated column lines in a selected state.

3. A method of generating a column select signal for selecting a column of memory cells in a memory cell array having a plurality of memory cells arranged in a row and columns, said memory array including a plurality of column lines each connecting a column of memory cells, comprising the steps of:
    counting a clock signal;
    generating a count coincidence signal each time the number of counts of said clock signals becomes coincident with the number of the column lines; and
    in response to said clock signal, shifting said coincidence signal to sequentially generate column selection signal for setting the column lines sequentially in a selected state, and in which said shifting includes the step of receiving said count reach signal at a first stage of shift register stages corresponding to columns of the array to shift the count coincidence signal therethrough. and in which said shifting includes the step of receiving said count coincidence signal at a first stage of shift register stages corresponding to columns of the array to shift the count coincidence signal therethrough, and
    initializing said counting means responsive to said count coincidence signal.

4. An address pointer for generating a row designating signal for selecting a row of memory cells in a memory cell array having a plurality of memory cells arranged in rows and at least a column, comprising:
    counting means for counting a clock signal to generate a count coincidence signal when a count of said clock signal becomes coincident with a number of rows in said memory cell array;
    row selection means responsive to said clock signal for shifting said count coincidence signal to sequentially select each respective row of memory cells in said memory cell array, and wherein said row selection means includes cascaded N shift registers where N is the number of rows in said memory cell array and wherein
    said counting means includes cascaded N shift registers connected to said row selection means so as to form a recirculating pointer register.

5. An address pointer according to claim 4, wherein an output of each said shift register stage is coupled to a row select line for selecting an associated row of memory cells in said memory cell array.

6. An address pointer according to claim 4, wherein said counting means includes counter means for counting said clock signals, preloading means for preloading an initial count data for said counter means, and signal generating means responsive to said counter means for generating said count coincidence signal when outputs of said counter means all are the same in logic level.

7. An address pointer according to claim 6, wherein said at least a column includes a plurality of columns, and wherein said address pointer further includes:
    column clock generating means, responsive to said count coincidence signal from said counting means, for passing said clock signal to generate a column clock, column counting means for counting said column clock to generate a column count coincidence signal when the count of the column clock becomes coincident with the number of said plurality of columns, and column select means responsive to said column clock for sequentially shifting said column count coincident signal to sequentially generate column selection signals for sequential selection of the columns.

8. An address pointer according to claim 4, wherein said at least a column includes a plurality of columns, and wherein said address pointer further includes:
column clock generating means, responsive to said count coincidence signal from said counting means for passing said clock signal to generate a column clock, column counting means for counting said column clock to generate a column count coincidence signal when the count of the column clock becomes coincident with the number of said plurality of columns, and column select means responsive to said column clock for sequentially shifting said column count coincidence signal to sequentially generate column selection signals for sequential selection of the columns.

9. An address pointer according to claim 8, wherein said column select means includes a plurality of cascadedly connected shift registers corresponding to said plurality of columns, an output of each said shift register being coupled to an associated column select line for selecting a corresponding column, and a shift register at the first stage receiving said column count coincidence signal.

10. An address pointer according to claim 8, wherein said column counting means includes an asynchronous binary counter of multi outputs, column preloading means for preloading an initial count data in said asynchronous binary counter, and logic means for detecting all said multi outputs being at the same logic level to generate said column count coincidence signal.

11. An apparatus according to claim 8, further including means responsive to column count coincidence signal for initializing said column counting means.

12. An address pointer for generating a column designating signal for selecting a column of memory cells in a memory cell array having a plurality of memory cells arranged in columns and at least a row, comprising:
counting means for counting a clock signal to generate a count coincidence signal when a count of said clock signal becomes coincident with the number of column select lines each selecting a column in said memory cell array;
column selection means responsive to said clock signal for shifting said count coincidence signal to sequentially select each respective column select line and wherein said column selection means includes cascaded N shift registers where N is the number of columns in said memory cell array and wherein
said counting means includes cascaded N shift registers connected to said column selection means so as to form a recirculating pointer register.

13. An address pointer according to claim 12, wherein
said column selection means includes a plurality of cascadedly connected shift register stages corresponding to respective column select lines for receiving and shifting sid count coincidence signal, an output of each said shift register stage being coupled to a corresponding column select line for selecting an associated column of memory cells in said memory cell array.

14. An address pointer according to claim 12, wherein said counting means includes counter means for counting said clock signals, preloading means for preloading an initial count data into said counter means, and signal generating means responsive to said counter means for generating said count coincidence signal when all the outputs of said counter means are the same in logic level.

15. An address pointer according to claim 14, wherein said counter means comprises an asynchronous binary counter having a plurality of binary counters in which said clock signal is applied to a binary counter at the first stage and each said binary counter at the second and subsequent stage has a clock input connected to receive an output of the binary counter at a preceding stage.

16. An address pointer for generating a row designating signal for selecting a row of memory cells in a memory cell array having a plurality of memory cells arranged in rows and at least a column, comprising:
counting means for counting a clock signal to generate a count coincidence signal when a count of said clock signal becomes coincident with a number of rows in said memory cell array;
row selection means responsive to said clock signal for shifting said count coincidence signal to sequentially select each respective row of memory cells in said memory cell array, said row selection means including a plurality of cascaded shift register stages corresponding to respective rows in said memory cell array and a first shift register stage for receiving and shifting said count coincidence signal, and
means responsive to said count coincidence signal for initializing said counting means.

17. An address pointer for generating a column designating signal for selecting a column of memory cells in a memory cell array having a plurality of memory cells arranged in columns and at least a row, comprising:
counting means for counting a clock signal to generate a count coincidence signal when a count of said clock signal becomes coincident with the number of column select lines each selecting a column in said memory cell array;
column selection means responsive to said clock signal for shifting said count coincidence signal to sequentially select each respective column select line, said column selection means including a plurality of cascaded shift register stages corresponding to respective columns in said memory cell array and a first shift register stage for receiving and shifting said count coincidence signal, and
means responsive to said count coincidence signal for initializing said counting means.

* * * * *